United States Patent
Jung

(10) Patent No.: US 7,319,632 B2
(45) Date of Patent: Jan. 15, 2008

(54) PSEUDO-DUAL PORT MEMORY HAVING A CLOCK FOR EACH PORT

(75) Inventor: Chang Ho Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 219 days.

(21) Appl. No.: 11/282,345

(22) Filed: Nov. 17, 2005

(65) Prior Publication Data

US 2007/0109884 A1    May 17, 2007

(51) Int. Cl.
*G11C 8/00* (2006.01)
(52) U.S. Cl. .................................. 365/230.05; 365/154
(58) Field of Classification Search ........... 365/230.05, 365/154, 233
See application file for complete search history.

(56) References Cited

U.S. PATENT DOCUMENTS

| | | | | |
|---|---|---|---|---|
| 5,612,923 A | * | 3/1997 | Gibson et al. | 365/230.05 |
| 5,907,508 A | * | 5/1999 | Lattimore et al. | 365/189.04 |
| 6,862,247 B2 | * | 3/2005 | Yamazaki | 365/233 |
| 6,882,562 B2 | * | 4/2005 | Beucler | 365/154 |

* cited by examiner

*Primary Examiner*—Anh Phung
(74) *Attorney, Agent, or Firm*—Nicholas J. Pauley; John L. Ciccozzi; Thomas Rouse

(57) ABSTRACT

A pseudo-dual port memory has a first port, a second port, and an array of six-transistor memory cells. A first memory access is initiated upon a rising edge of a first clock signal received onto the first port. A second memory access is initiated in response to a rising edge of a second clock signal received onto the second port. If the rising edge of the second clock signal occurs within a first period of time, then the second memory access is initiated immediately following completion of the first memory access in pseudo-dual port fashion. If the rising edge of the second clock signal occurs later within a second period of time, then the second memory access is delayed until after a second rising edge of the first clock signal. The durations of the first and second memory accesses do not depend on the duty cycles of the clock signals.

22 Claims, 12 Drawing Sheets

CELL ARRAY

ADDRESS INPUT LATCH AND
READ/WRITE MULTIPLEXER

DATA INTPUT LATCH AND DIN
DATA CONTROL

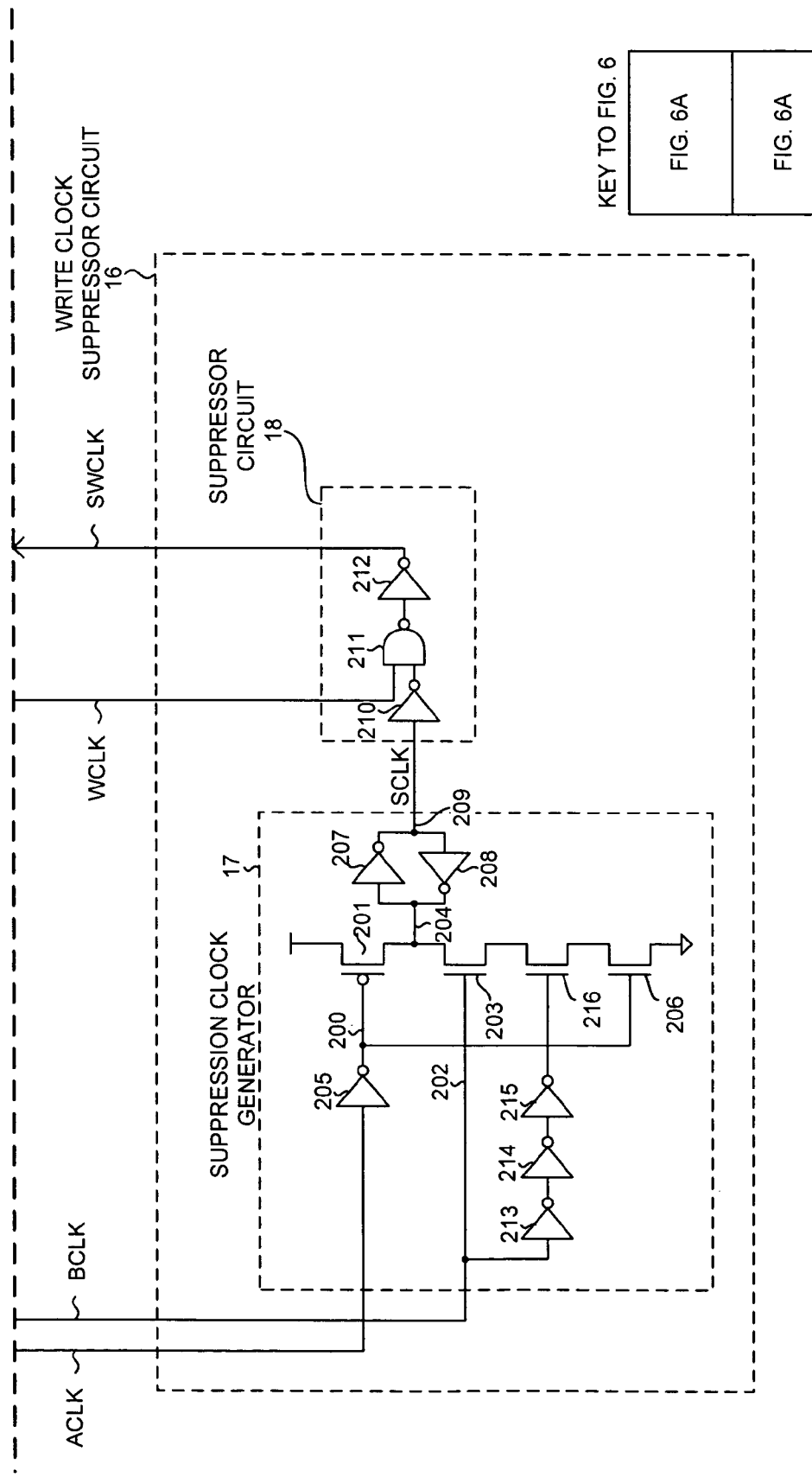

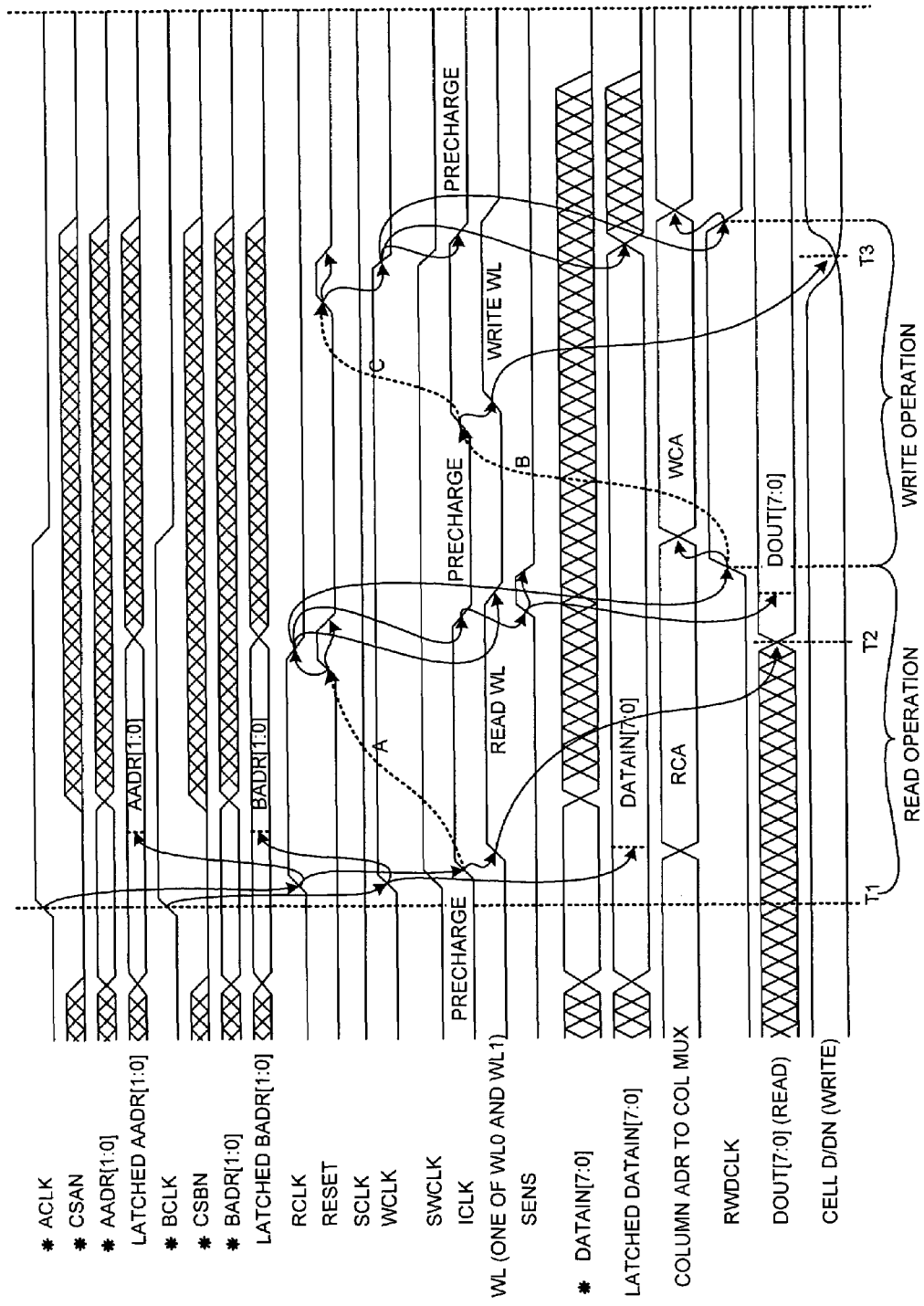
FIG. 7 (CASE #1)

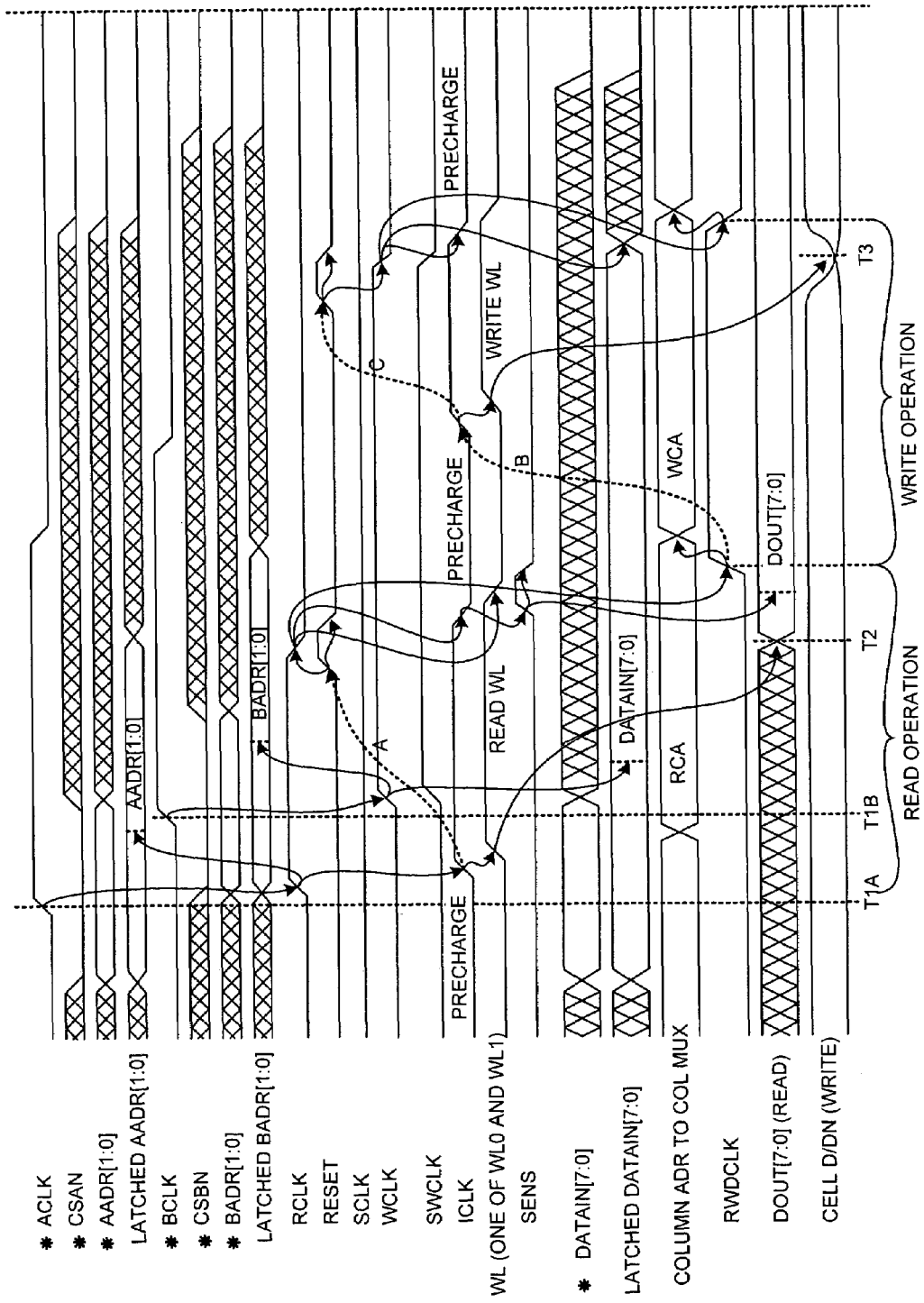

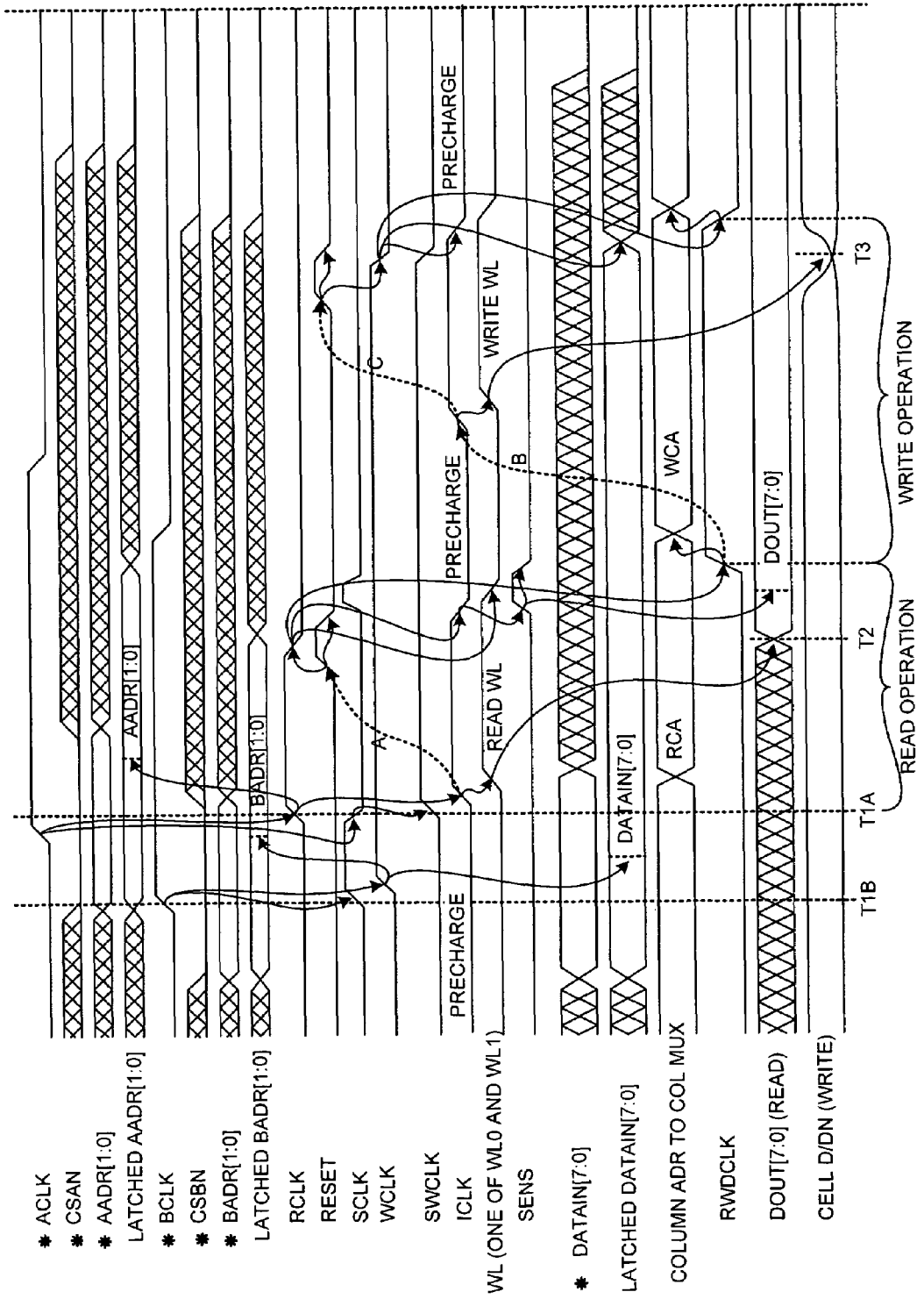
FIG. 9 (CASE #3)

CASE #1
(ACLK SAME TIME AS BCLK)

CASE #2
(ACLK BEFORE BCLK)

CASE #3
(BCLK BEFORE ACLK)

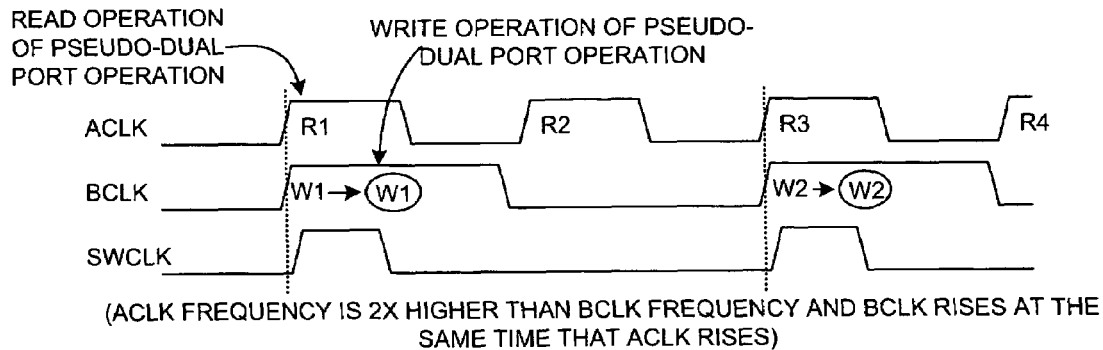

(ACLK FREQUENCY IS 2X HIGHER THAN BCLK FREQUENCY AND BCLK RISES AT THE SAME TIME THAT ACLK RISES)

FIG. 10

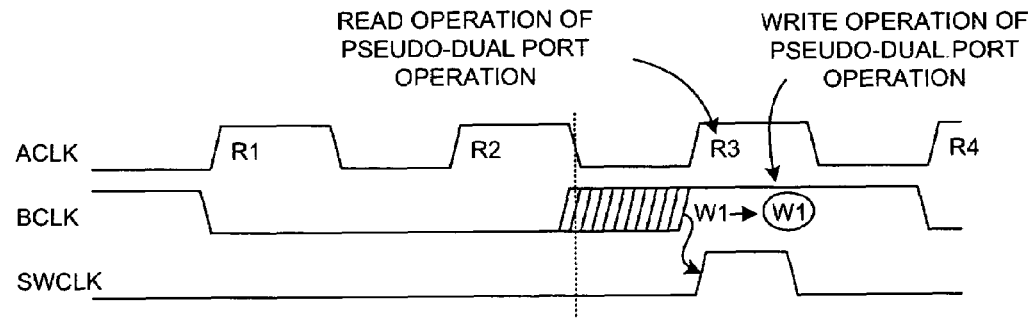

(IF BCLK RISING EDGE IS LESS THAN THREE GATE DELAYS EARLIER THAN ACLK FALLING EDGE, THEN SCLK GOES HIGH AT BCLK RISING EDGE WHEN ACLK IS LOW - WRITE OPERATION W1 IS DELAYED UNTIL AFTER NEXT READ OPERATION R3)

FIG. 11

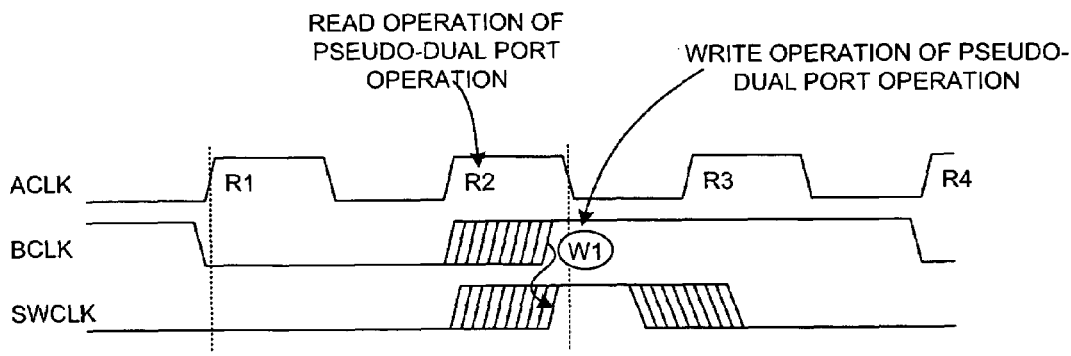

(IF BCLK RISING EDGE IS MORE THAN THREE GATE DELAYS EARLIER THAN ACLK FALLING EDGE, THEN SCLK REMAINS LOW AND THE WRITE OPERATION W1 WILL START JUST AFTER THE PREVIOUS READ OPERATION R2)

FIG. 12

PSEUDO-DUAL PORT MEMORY HAVING A CLOCK FOR EACH PORT

BACKGROUND

1. Field

The disclosed embodiments relate generally to pseudo-dual port memories.

2. Background

Dual port memories typically have two ports and an array of memory cells. The memory array can be simultaneously accessed from both of the ports provided that the memory cells being accessed from one port are not the same memory cells that are being accessed from the other port. A common type of memory cell used in such dual port memories involves eight field effect transistors (FETs). Four of the transistors are interconnected to form two cross-coupled inverters. A first data node D of the memory cell is the node at the output lead of a first of the inverters and the input lead of the second of the inverters. A second data node DN of the memory cell is the node at the output lead of the second of the inverters and the input lead of the first of the inverters. There are two access transistors coupled to the first data node D. The first access transistor is provided so that a first bit line B1 can selectively be coupled to the first data node D. The second access transistor is provided so that a second bit line B2 can selectively be coupled to the first data node D. Similarly, there are two access transistors coupled to the second data node DN. The first access transistor is provided so that a first bit line bar B1N can be coupled to the second node DN. The second access transistor is provided so that a second bit line bar B2N can be coupled to the second node DN. The first bit line B1 and first bit line bar B1N constitute a bit line pair and a for coupling an addressed memory cell to a first of the two ports of the dual port memory. The second bit line B2 and second bit line bar B2N constitute a bit line pair and are for coupling an addressed memory cell to a second of the two ports of the dual port memory.

The memory cells in a single port memory typically only include six transistors. As in the case of the eight-transistor cell, four of the transistors form a cross-coupled inverter structure. Rather than there being two pairs of access transistors as in the eight transistor cell, however, the six transistor cell has only one pair of access transistors. A first access transistor is provided for selectively coupling the first data node D of the cross-coupled inverters to a bit line B. A second access transistor is provided for coupling a second data node DN of the cross-coupled inverters to a bit line bar BN. The six-transistor memory cell typically consumes only about half as much integrated circuit area than the eight-transistor cell when the two types of memory cells are fabricated using the same process.

In order to take advantage of the smaller size of the six-transistor memory cell, a memory device called a pseudo-dual port memory is often used. In one example, a pseudo-dual port memory has a single memory array where each memory cell of the array is a six-transistor memory cell that can be selectively coupled to a single pair of bit lines (for example, bit line B and bit line bar BN). The memory array operates as a single port memory in that only one memory access is performed at one time.

The pseudo-dual port memory, however, mimics a dual port memory in that it has two ports. In one example, the pseudo-dual port memory has circuitry sometimes called a Time Delayed Multiplexer (TDM). A single input clock signal is received onto the pseudo-dual port memory and this single input clock signal is used to latch an input read address, an input write address, and an input data value. The rising edge of the input clock signal is used to initiate a read operation using the input read address. The read operation is completed. Thereafter, the falling edge of the input clock signal occurs. The TDM uses the falling edge of the input clock signal to initiate a write operation. The input write address is used to address the memory array during the write operation and the data written into the memory array is the input data value. Although two memory operations are performed in a single cycle of the input clock signal, the two memory operations are in reality performed one after the other. From outside the pseudo-dual port memory, however, the pseudo-dual port memory appears to allow two accesses of the memory array at the same time or substantially at the same time.

The inventor has recognized that the amount of time required to perform the first read memory operation may not be equal to the amount of time required to perform the second write memory operation. Using a conventional TDM approach slows overall memory access times because the relative amounts of time available for the two operations is determined by the time when the rising edge of the clock cycle occurs and the time when the falling edge of the clock cycle occurs. If, for example, the clock signal is low for as long as it is high in a clock cycle (i.e., the clock signal has a 50/50 duty cycle), then the same amount of time must be allowed for performing both the faster read operation and the slower write operation. The result is an amount of wasted time that starts after the read operation has been completed and ends upon the falling edge of the clock signal.

Not only does the conventional TDM approach sometimes slow overall memory access times in situations where the relative amounts of time required to perform the two memory access does not match the duty cycle of the clock signal, but the conventional TDM approach also can cause overall memory access times to be slower than they otherwise would have to be due to the use of the falling edge of the clock signal to initiate operations. There may be jitter in the duty cycle of the clock signal such that the timing of the falling edge of the clock signal changes from clock cycle to clock cycle. If the circuitry is optimized for operation under one clock signal duty cycle condition, then it typically is not optimized for operation under another clock signal duty cycle condition. A time margin is typically built into the circuitry so that the circuitry of the pseudo-dual port memory will operate correctly under all clock signal duty cycle conditions. This time margin translates into wasted time under certain operating conditions where the time margin is not required for proper operation. The maximum clock frequency of the pseudo-dual port memory is therefore specified to be lower than it could be were there no such time margin.

Whereas the pseudo-dual port memory described above has a single input clock signal, it would be desirable in some applications for a pseudo-dual port memory to have a first port that was clocked with a first input clock signal and a second port that was clocked with a second input clock signal. By providing two separate input clocks, the use of one port could be made largely independent of the use of the other port. By making the two ports more independent, use of the pseudo-dual port memory could be simplified.

In view of the above, an improved pseudo-dual port memory is desired that does not use both the rising and falling edges of the same input clock signal to control the ordering of two memory operations that also has two separate ports where each port has its own input clock.

SUMMARY INFORMATION

A pseudo-dual port memory has a first port, a second port, and an array of six-transistor memory cells. The first port (for example, a read only port) includes a clock input lead for receiving a first clock signal. The second port (for example, a write only port) includes a clock input lead for receiving a second clock signal.

A first memory access (for example, a read memory access operation) of the array is initiated by a rising edge of a first clock signal received onto the clock input lead of the first port. A second memory access (for example, a write memory access operation) of the array is initiated in response to a rising edge of a second clock signal received onto the clock input lead of the second port. If the rising edge of the second clock signal occurs within a first period of time (for example, when the first clock signal transitions high or during the following amount of time that the first clock signal is high), then the second memory access is initiated substantially immediately following completion of the first memory access. If, on the other hand, the rising edge of the second clock signal occurs later within a second period of time (for example, during the later period of time when the first clock signal is low), then initiation of the second memory access does not immediately follow completion of the first memory access but rather is delayed until after a second rising edge of the first clock signal. Where the second rising edge of the first clock signal initiates a third memory access operation through the first port, the second memory access operation occurs after the third memory access operation.

One example of circuitry that detects when the rising edge of the second clock signal occurs relative to the first clock signal and that causes initiation of the second memory access to be delayed, if such delay is appropriate, is described in the detailed description section below. The circuitry involves a time delayed multiplexer that receives a read clock signal for the first memory access (a read operation) and a write clock signal for the second memory access (a write operation). The time delayed multiplexer outputs a control signal that determines whether the array of memory cells is addressed for the first memory access or is addressed for the second memory access. The circuitry further includes a write clock suppressor circuit. If the rising edge of the second clock signal occurs too late (when the first clock signal is low) for the time delayed multiplexer to work properly in initiating the second memory access operation immediately following the already initiated first memory access operation, then the write clock suppressor circuit suppresses the write clock signal supplied to the time delayed multiplexer, thereby delaying initiation of the second memory access operation until after the second rising edge of the first clock signal.

In contrast to a conventional pseudo-dual port memory where the falling edge of an input clock is used to time when a second memory access starts, the durations of the first and second memory accesses in the novel pseudo-dual port memory disclosed in this patent document do not depend on when the falling edge of a clock signal occurs. Rather, the duration of the first memory access is largely dependent upon a propagation delay (for example, the delay introduced by a one shot circuit). The duration of the second memory access is largely dependent upon a propagation delay (for example, a propagation delay through random logic and/or the delay introduced by the one shot circuit). The ratio of the amount of time allotted to the first memory access versus the amount of time allotted to the second memory access can be adjusted during the design phase of the pseudo-dual port memory by adjusting the ratios and magnitudes of the propagation delays. The ratio of the amount of time allotted to the first memory access versus the amount of time allotted to the second memory access is substantially independent of the duty cycle of either the first clock signal or the second clock signal.

Additional hardware embodiments, additional methods, and additional details are described in the detailed description below. This summary does not purport to define the invention. The invention is defined by the claims.

BRIEF DESCRIPTION OF THE DRAWINGS

FIG. 7 is a waveform diagram that illustrates a first scenario (Case #1) of an operation of the pseudo-dual port memory device 1 of FIGS. 1-6.

FIG. 8 is a waveform diagram that illustrates a second scenario (Case #2) of an operation of the pseudo-dual port memory device 1 of FIGS. 1-6.

FIG. 9 is a waveform diagram that illustrates a second scenario (Case #3) of an operation of the pseudo-dual port memory device 1 of FIGS. 1-6.

FIG. 10 is a simplified waveform diagram of a first example where the frequency of ACLK is higher than the frequency of BCLK, but BCLK rises at the same time that ACLK rises.

FIG. 11 is a simplified waveform diagram of a second example where BCLK rises during the time ACLK is low.

FIG. 12 is a simplified waveform diagram of a third example where BCLK rises during the time ACLK is high.

DETAILED DESCRIPTION

Figure 1:
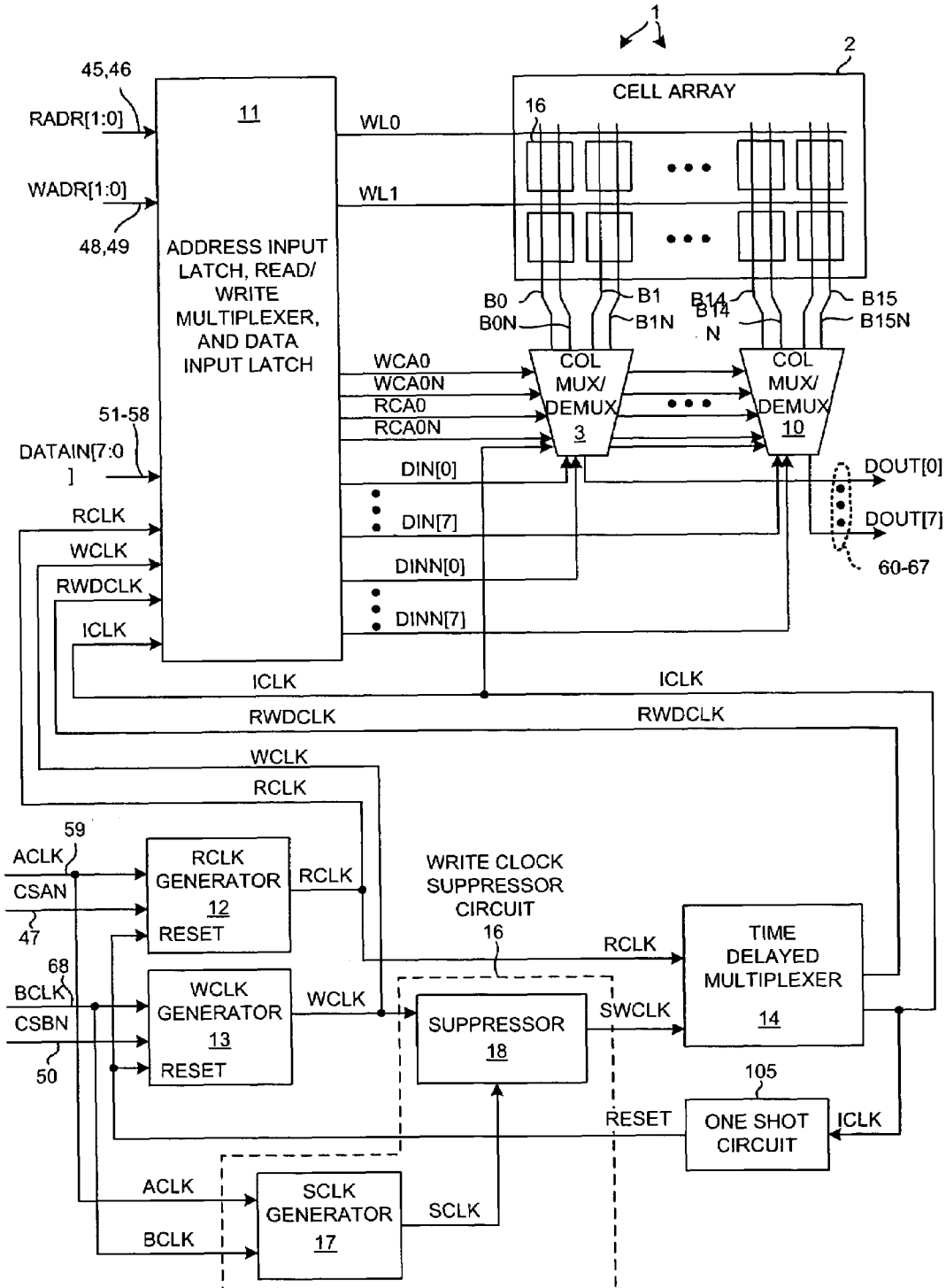
FIG. 1 is a high-level block diagram of a pseudo-dual port memory device 1 in accordance with one embodiment.

FIG. 1 is a high-level block diagram of a pseudo-dual port memory device 1 in accordance with one embodiment. Memory device 1 includes an array 2 of static random access memory cells. In the illustrated example, array 2 includes two rows of memory cells, where each row includes sixteen memory cells. In addition to array 2, memory device 1 includes a set of eight column multiplexer/demultiplexers 3-10. Only the first and eighth column multiplexer/demultiplexers 3 and 10 are illustrated. Memory device 1 also includes an address input latch, read/write multiplexer, and data input latch circuit 11, a read clock generator circuit 12, a write clock generator circuit 13, a time delayed multiplexer circuit 14, a one shot circuit 15, and a write clock suppressor circuit 16. Write clock suppressor circuit 16 includes an suppressor clock generator circuit 17 and a suppressor circuit 18. The circuitry in blocks 3-15 is control circuitry that controls access to array 2.

Figure 2:
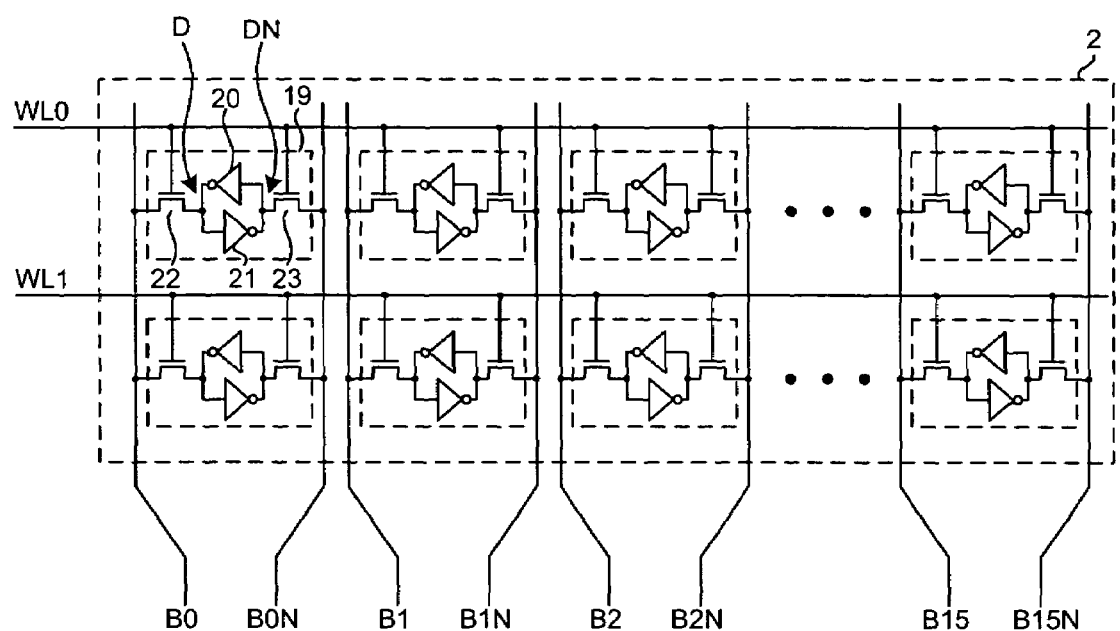
FIG. 2 is a more detailed diagram of memory array 2 of FIG. 1.

FIG. 2 is a more detailed diagram of memory array 2. Each of the memory cells is a six-transistor memory cell. Reference numeral 19 identifies the memory cell in the upper left hand corner of the array. Four of the transistors of memory cell 19 are interconnected to form a pair of cross-coupled inverters 20 and 21. A first data node D of memory cell 19 is coupled to the output lead of inverter 20 and is coupled to the input lead of inverter 21. A second data node DN of memory cell 19 is coupled to the output lead of inverter 21 and is coupled to the input lead of inverter 20. A first access transistor 22 is provided so that data node D can be selectively coupled to a vertically extending bit line B0. A second access transistor 23 is provided so that data node DN can be selectively coupled to a vertically extending bit line B0N. As illustrated, pairs of bit lines B0 and B0N, B1 and B1N . . . B15 and B15N extend through the array in the vertical dimension. For example, the pair of bit lines B0 and B0N extends vertically up through the leftmost column of memory cells. The "N" suffix in this notation indicates "not", or the complement of the signal having the same signal name without the "N" suffix. A pair of word lines WL0 and WL1 extends through the array in the horizontal dimension. Word line WL0 is coupled to the gates of the access transistors of the various memory cells of the upper row of memory cells of the array. Word line WL1 is coupled to the gates of the access transistors of the various memory cells of the lower row of memory cells of the array.

Figure 3:
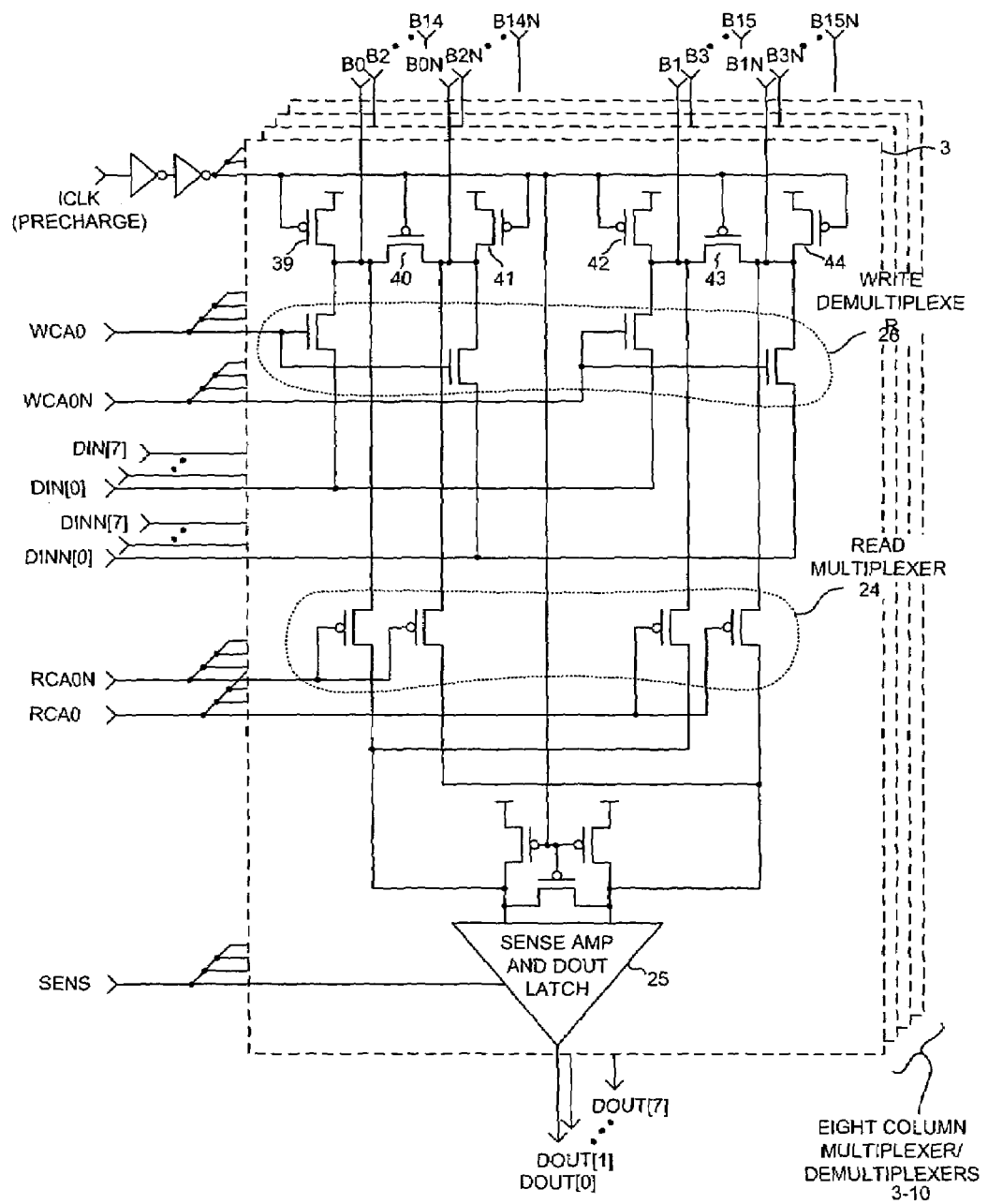
FIG. 3 is a more detailed diagram of the eight column multiplexer/demultiplexers 3-10 of FIG. 1.

FIG. 3 is a more detailed diagram of the eight column multiplexer/demultiplexers 3-10 of FIG. 1. Each column multiplexer/demultiplexer has two pairs of bit line leads. Column multiplexer/demultiplexer 3, for example, has leads that are coupled to a first pair of bit lines B0 and B0N and also has leads that are coupled to a second pair of bit lines B1 and B1N. The two pairs of bit lines are illustrated extending down from the top into the column multiplexer/demultiplexer 3 in FIG. 3.

Each column multiplexer/demultiplexer receives a read column address RCA0 and its complement RCA0N. During a read operation, one of the two pairs of bit lines is multiplexed by multiplexer 24 onto a differential pair of input leads of a sense amplifier 25. Which one of the two pairs of bit lines is determined by the values RCA0 and RCA0N. Sense amplifier 25 includes a latch that latches the value being output onto the data output lead of the column multiplexer/demultiplexer. The latch is transparent when an input signal SENS is low and the latch latches on a low-to-high transition of the signal SENS. The data output leads DOUT[0:7] of memory device 1 are the data output leads of the eight column multiplexers/demultiplexers 3-10, respectively.

Each column multiplexer/demultiplexer also receives an internal clock signal ICLK. The signal ICLK is a precharge signal that causes the bits lines to be precharged when ICLK is low. The ICLK signal is described in further detail below.

Each column multiplexer/demultiplexer also receives a write column address WCA0 and its complement WCA0N. Each column multiplexer/demultiplexer also receives a latched data input value and its complement. The first column multiplexer/demultiplexer 3, for example, receives latches input data value DIN[0] and its complement DINN[0]. During a write operation, the input data values DIN[0] and DINN[0] are demultiplexed by demultiplexer 26 onto one of the two pairs of bit lines that are coupled to the column multiplexer/demultiplexer 3. The particular pair of bit lines is determined by the write column address WCA0 and its complement WCA0N. Accordingly, during a read operation data passes from a selected pair of the bit lines, through multiplexer 24, through the sense amplifier 25, and onto the data output lead DOUT[0] of the column multiplexer/demultiplexer 3. During a write operation, data passes from the data input leads DIN[0] and DINN[0], through demultiplexer 26, and onto a selected pair of the bit lines B0 and B0N or B1 and B1N.

Figure 4:
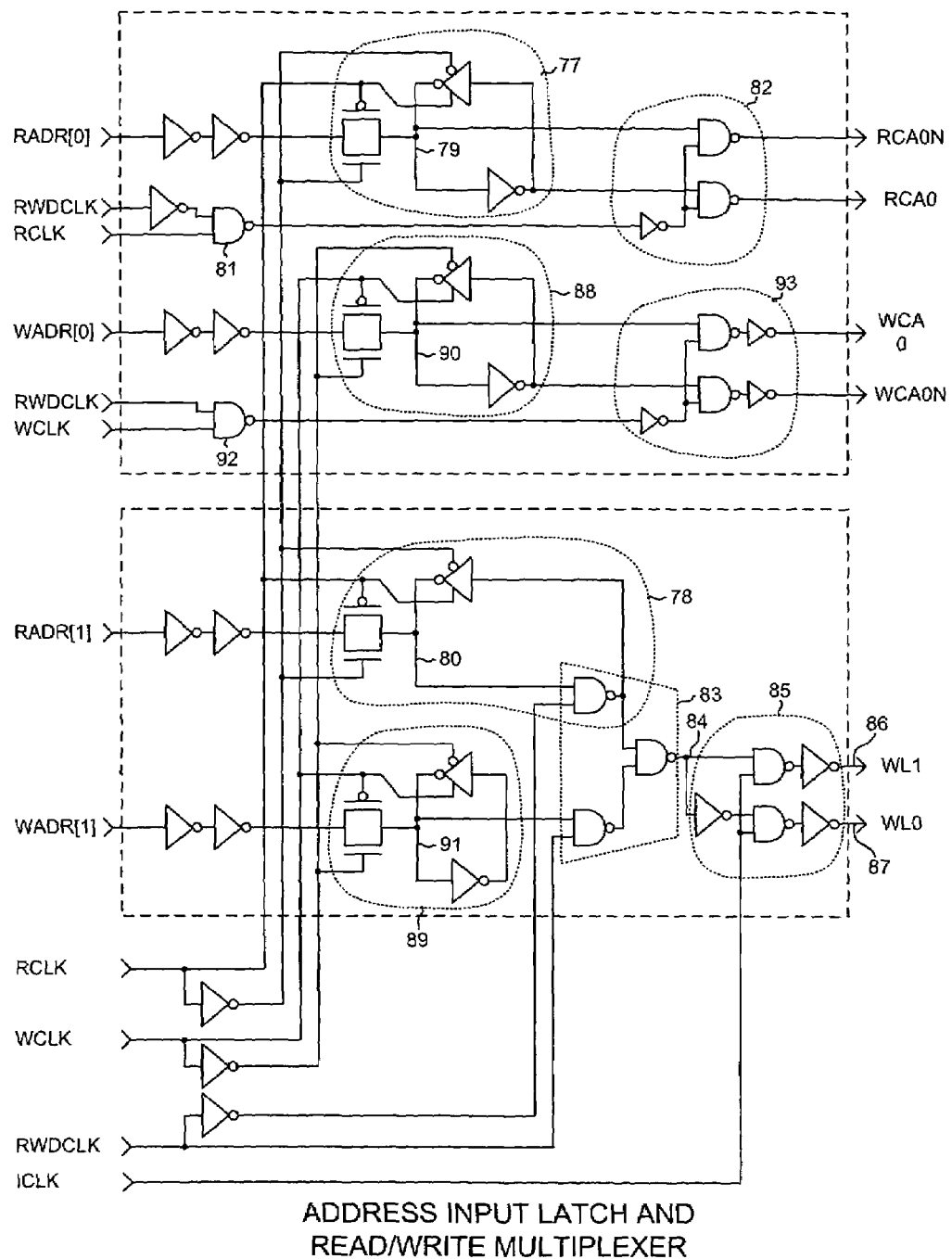
FIG. 4 is a more detailed diagram of the address input latch and read/write multiplexer portion of block 11 of FIG. 1.

FIG. 4 is a more detailed diagram of the address input latch and read/write multiplexer portion of block 11 of FIG. 1. The circuit of FIG. 4 latches an incoming two-bit read address RADR[1:0] and also latches an incoming two-bit write address WADR[1:O]. The circuit of FIG. 4 outputs word line values WL1 and WL0, read column address values RCA0 and RCA0N, and write column address values WCA0 and WCA0N.

Figure 5:
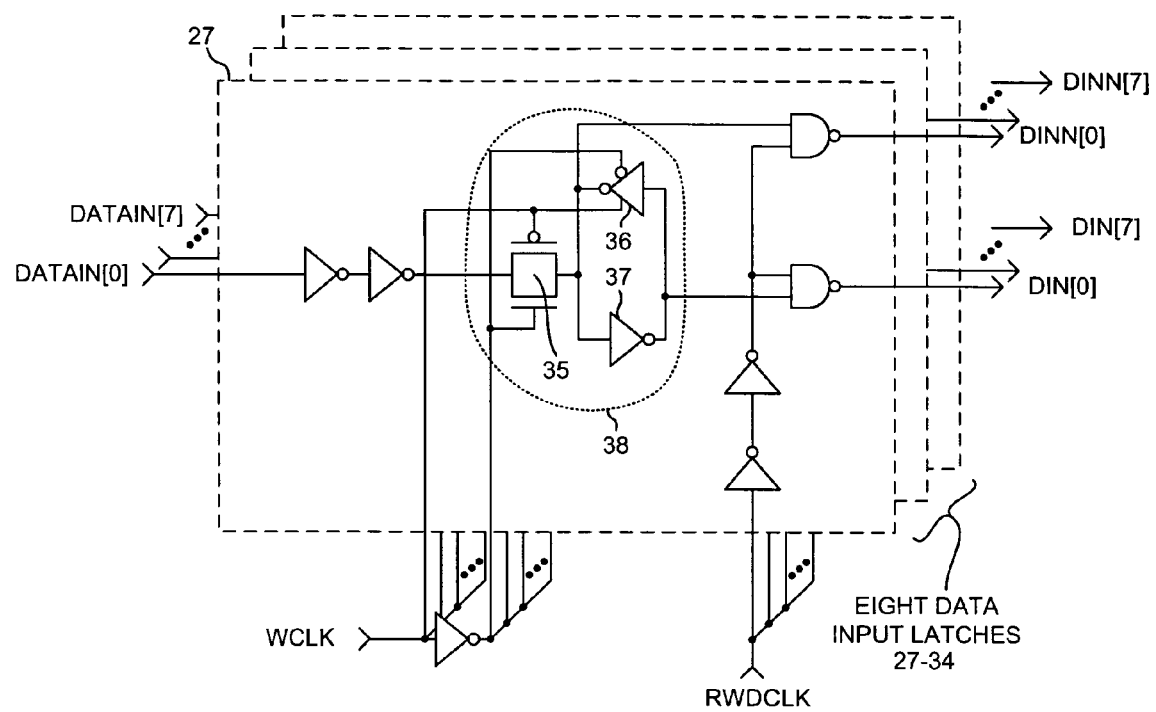
FIG. 5 is a more detailed diagram of the data input latch portion of block 11 of FIG. 1.

FIG. 5 is a more detailed diagram of the data input latch portion of block 11 of FIG. 1. As illustrated, there are eight identical data input latches 27-34 that are organized in parallel so that they latch an eight-bit input data value DATAIN[7:0] and output an eight-bit latched data value DIN[7:0] and its complement DINN[7:0]. A write clock signal WCLK is used to latch the incoming input data value DATAIN[7:0] into the eight data input latches. Each data input latch is transparent when the write clock signal WCLK is low, and latches when the write clock signal WCLK transitions low-to-high. In data input latch 27, the transistors making up the pass gate 35 and the cross-coupled inverters 36 and 37 together form a transparent latch 38. The digital value stored in the data input latch as well as the complement of the digital value stored are supplied onto the data leads DIN[0] and DINN[0] of the data input latch when the read/write decoding clock signal RWDCLK is asserted high. If, on the other hand, the signal RWDCLK is low, then both the signal on both the DIN[0] and DINN[0] output leads are forced high.

Figure 6A:
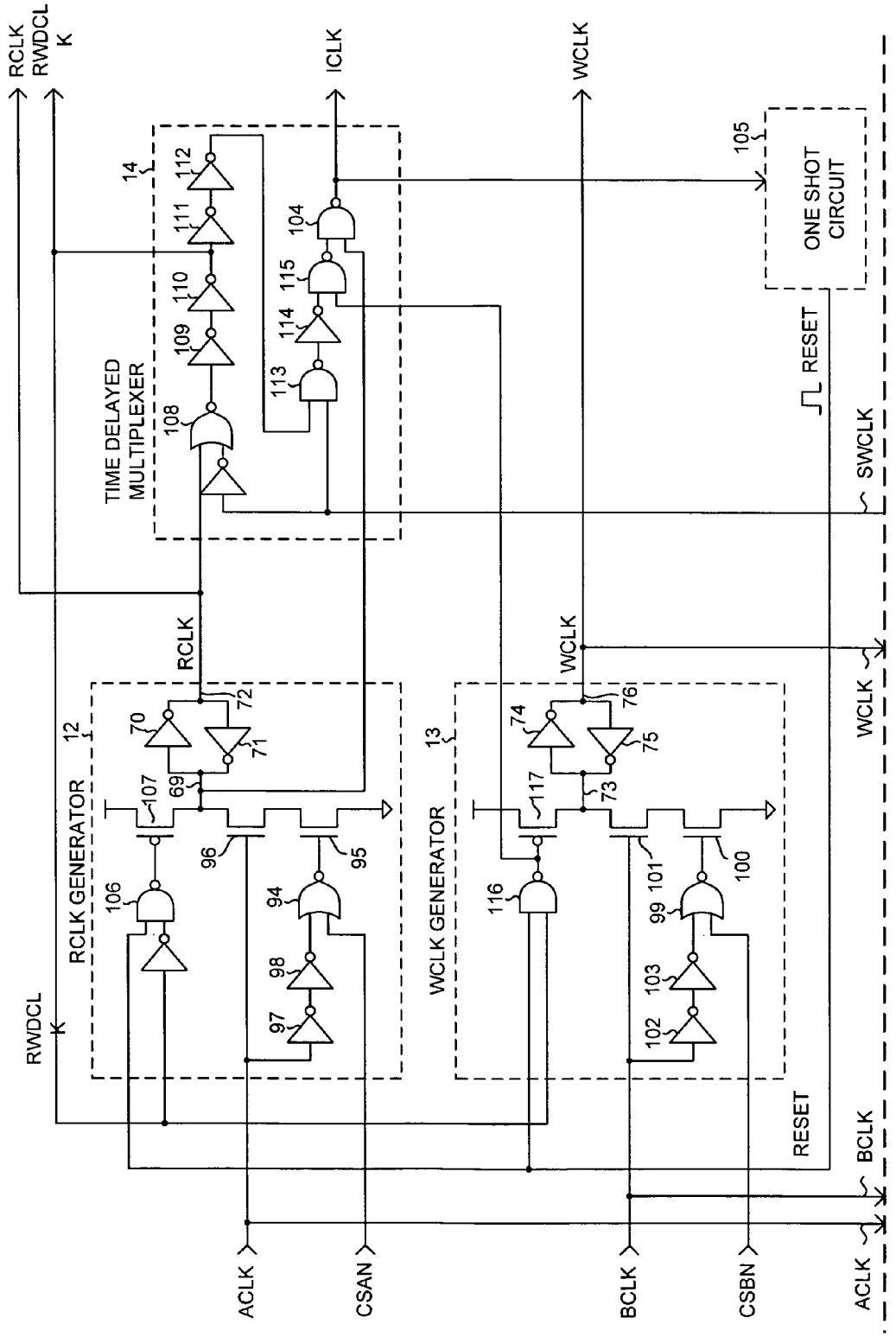
FIG. 6 is a more detailed diagram of the read clock generator circuit 12, the write clock generator circuit 13, the time delayed multiplexer circuit 14, the write clock suppressor circuit 16, and the one shot circuit 105 of FIG. 1.

FIG. 6 is a more detailed diagram of the read clock generator circuit 12, the write clock generator circuit 13, the time delayed multiplexer circuit 14, the one shot circuit 15, and the write clock suppressor circuit 16 of FIG. 1. The circuitry of FIG. 6 outputs a read clock signal RCLK, a write clock signal WCLK, the internal clock signal ICLK, and the read/write decoding clock signal RWDCLK.

Operation of pseudo-dual port memory device 1 is described below in connection with the waveforms diagrams of FIGS. 7-9. FIG. 7 is a waveform diagram of a first scenario (Case #1) in which the rising edges of the input clock signal ACLK for the first port and the input clock signal BCLK for the second port occur simultaneously. FIG. 8 is a waveform diagram of a second scenario (Case #2) in which the rising edge of the input clock signal ACLK for the first port precedes the rising edge of the input clock signal BCLK for the second port. FIG. 9 is a waveform diagram of a third scenario (Case #3) in which the rising edge of the input clock signal BCLK for the second port precedes the input clock signal ACLK for the first port.

Signals names preceded in FIGS. 7-9 with an asterisk are externally supplied input signals that are supplied to the pseudo-dual port memory device 1.

Initially, the clock signal ICLK is low as illustrated in FIG. 7. ICLK is supplied to the column multiplexer/demultiplexers 3-10 as illustrated in FIG. 3. When ICLK is low, the P-channel transistors 39-41 and 42-44 in each of the column multiplexer/demultiplexers are conductive. All the pairs of bit lines are therefore precharged to supply voltage VCC. This precharging of the bit lines is an initial condition.

Because a read operation is to be performed, a two-bit read address RADR[1:0] is placed on the two read address input leads 45 and 46 of pseudo-dual port memory 1, and the read select signal CSAN is asserted on input lead 47 of pseudo-dual port memory 1. Because a write operation is also to be performed, a two-bit write address WADR[1:0] is placed on the two write address input leads 48 and 49 of pseudo-dual port memory 1, and the write select signal CSBN is asserted on input lead 50 of pseudo-dual port memory 1. The eight-bit data value DATAIN[7:0] that is to be written during the write operation is supplied onto the eight data input leads 51-58 of the pseudo-dual port memory 1. The read address input leads 45 and 46, a read clock input lead 59, and the data output leads 60-67 constitute a first port (a read only port) of the pseudo-dual port memory device 1. The write address input leads 48 and 49, a write clock input lead 68, and the data input leads 51-58 constitute a second port (a write only port) of the pseudo-dual port memory device 1.

After the information on input leads 45-58 and 68 has been set up for a period of time, the first input clock signal ACLK on input lead 47 and the second input clock signal BCLK on input lead 50 transition high simultaneously at time T1 (see FIG. 7). When the first input clock signal ACLK transitions high, the value of the read select signal CSAN is latched into the latch of the RCLK generator circuit 12 of FIG. 6. If CSAN is low, then the voltage on latch node 69 is pulled to ground and is latched by cross-coupled inverters 70-71. If CSAN is high, then the voltage on node 69 would have remained in its previously latched state. As the waveform diagram of FIG. 7 shows, CSAN is low in the presently described operational example. A digital low is therefore latched onto node 69. A digital high is therefore latched onto node 72. The digital value on node 72 is the value of the read clock signal RCLK. The read clock signal RCLK therefore transitions high as illustrated in FIG. 7.

In a similar fashion, the write clock select signal CSBN is latched into the latch of the write clock generator 13 of FIG. 6. If CSBN is low, then the voltage on node 73 is pulled to ground and is latched by cross-coupled inverters 74-75. If CSBN is high, then the voltage on node 73 remains in its previously latched state. As the waveform diagram of FIG. 7 shows, CSBN is low in the presently described operational example. A digital low is therefore latched onto node 73, and a digital high is latched onto node 76. The digital value on node 76 is the value of the write clock signal WCLK. The write clock signal WCLK therefore transitions high as illustrated in FIG. 7.

In the waveform of FIG. 7, both ACLK and BCLK were initially digital lows. Because ACLK was low, a digital high was present on node 200 in the suppression clock generator 17 of FIG. 6. P-channel transistor 201 was therefore nonconductive. Because BCLK was low, a digital low was present on node 202 in the suppression clock generator 17 of FIG. 6. N-channel transistor 203 was therefore non-conductive. Node 204 therefore remained latched to hold it previous digital value. When ACLK transitions high as illustrated in FIG. 7, inverter 205 asserts a digital low onto node 200, thereby causing P-channel transistor 201 to be conductive and causing N-channel transistor 206 to be nonconductive. Node 204 is therefore pulled up to a digital high. Cross-coupled inverters 207 and 208 are latched so that the voltage on node 209 is a digital low. The voltage on node 209 is the suppression clock signal SCLK. As long as ACLK is a digital high, the latch of the suppression clock generator 17 is held in this state, regardless of the value of BCLK. Note in FIG. 7 that the signal SCLK is a digital low at time T1 and remains a digital low thereafter.

The address input latch of FIG. 4 includes a pair of latches 77 and 78 for latching the two read address bit values RADR[0] and RADR[1], respectively. Latches 77 and 78 are transparent when signal RCLK is low, and latch on the rising edge of RCLK. The value of RADR[1] is therefore latched onto node 79 in latch 77 on the rising edge of RCLK. The value of RADR[1] is therefore latched onto node 80 in latch 78 on the rising edge of RCLK.

At time T1 in the waveform diagram of FIG. 7, RCLK is low and has not yet transitioned high. Latch 77 is therefore transparent. RADR[0] id therfore present on node 79. Because RCLK is low, NAND gate 81 outputs a digital high. Gating circuit 82 therefore asserts both RCA0 and RCA0N high. Because RCA0 and RCA0N are high and are driving the P-channel transistors of the write demultiplexers in the column multiplexer/demultiplexers of FIG. 3, the write demultiplexers are disabled and the bit lines are not coupled to the input leads of the sense amplifiers of the column multiplexer/demultiplexers. The write demultiplexers are disabled because the operation to be performed next is a read operation.

At time T1 in the waveform diagram of FIG. 7, RCLK is low and latch 78 is transparent. RADR[1]0 is therefore present on node 80. Because RWDCLK is a digital low as illustrated in FIG. 7, the latched value of RADR[1] on node 80 (see FIG. 4) is supplied through multiplexer 83 onto node 84. Because ICLK is low, however, gating circuit 85 blocks the signal on node 84 from being output onto the word line output leads 86 and 87. Digital low signals are present on the word line output leads 86 and 87. Because the access transistors of the memory cells of FIG. 4 are N-channel transistors, the low signals on WL0 and WL1 prevent any of the access transistors in the array 2 from being conductive.

The address input latch of FIG. 4 further includes a second pair of latches 88 and 89 for latching the two write address bit values WADR[0] and WADR[1], respectively. Latches 88 and 89 are transparent when signal WCLK is low, and latch on the rising edge of WCLK. The value of WADR[0] is therefore latched onto node 90 in latch 88 on the rising edge of WCLK. The value of WADR[1] is therefore latched onto node 91 in latch 89 on the rising edge of WCLK.

At time T1 in the waveform diagram of FIG. 7, WCLK is low and has not yet transitioned high. Latch 88 is therefore transparent. WADR[0] is therfore present on node 90. Because WCLK is low, NAND gate 92 outputs a digital high. Gating circuit 93 therefore forces both WCA0 and WCA0N low. Because WCA0 and WCA0N are low and are driving the N-channel transistors of the multiplexers in the column multiplexer/demultiplexers of FIG. 3, the demultiplexers are disabled and the bit lines are not coupled to the data input leads DIN[7:0] and DINN[7:0] of the column multiplexer/demultiplexers.

At time T1 in the waveform diagram of FIG. 7, WCLK is low and latch 89 is transparent. WADR[1] is therefore present on node 91. Because RWDCLK is a digital low as illustrated in FIG. 7, the value on node 91 is not supplied through multiplexer 83 onto node 84.

At time T1, ICLK is low. The transistors 39-44 in the column multiplexer/demultiplexers 3-10 are therefore conductive. The bit lines of each pair of bit lines are coupled together, and are coupled to supply voltage VCC. The bit lines are therefore said to be precharged.

Next, the externally supplied first input clock signal ACLK and the externally supplied second input clock signal BCLK transition high. The two clock signals ACLK and BCLK transition high simultaneously.

Before the transition of the signal ACLK, the signal ACLK was a digital low. CSAN was a digital low as indicated by the waveform of FIG. 7. NOR gate 94 of FIG. 6 therefore was supplying a digital high signal onto the gate of N-channel transistor 95. When ACLK transitions high, a high signal is present on the gate of N-channel transistor 96. Both N-channel transistors 96 and 95 are therefore conductive for a short amount of time until the digital high ACLK signal propagates through inverters 97 and 98 and NOR gate 94 to force the voltage on the gate of N-channel transistor 95 low. The voltage on node 69 is therefore pulled to ground momentarily through transistors 96 and 95. The voltage on node 69 is thereby latched to a digital low and the voltage on node 72 is latched to a digital high. This is illustrated in the waveform of FIG. 7 by the low-to-high transition of the signal RCLK.

A similar event happens in the WCLK generator 13. Before the low-to-high transition of the signal BCLK, CSAB was a digital low as indicated by the waveform of FIG. 7. NOR gate 99 of FIG. 6 therefore was supplying a digital high signal onto the gate of N-channel transistor 100. When BCLK transitions high, a high signal is present on the gate of N-channel transistor 101. Both N-channel transistors 101 and 100 are therefore conductive for a short amount of time until the digital high BCLK signal propagates through inverters 102 and 103 and NOR gate 99 to force the voltage on the gate of N-channel transistor 100 low. The voltage on node 73 is therefore pulled to ground momentarily through transistors 101 and 100. The voltage on node 73 is thereby latched to a digital low and the voltage on node 76 is latched to a digital high. This is illustrated in the waveform of FIG. 7 by the low-to-high transition of the signal WCLK.

When RCLK transitions high, latches 77 and 78 of FIG. 4 latch the read address values RADR[0] and RADR[1] onto nodes 79 and 80, respectively. This is illustrated in the waveform label LATCHED AADR[1:0] in FIG. 7 by the vertical dashed line. Because RCLK is high and RWDCLK is low, NAND gate 81 outputs a digital low signal. Gating circuit 82 therefore does not force both RCA0 and RCA0N high as before. The latched RADR[0] value on node 79 is output as RCA0 and its complement is output as RCA0N. The read column address values are supplied to the column multiplexer/demultiplexers 3-10 in preparation for the upcoming read operation. This is represented in FIG. 7 by the waveform labeled COLUMN ADR TO COL MUX. As seen in FIG. 3, the read column addresses RCA0 and RCA0N cause read multiplexer 24 to select one of the pairs of bit lines and to couple the selected pair to the input leads of sense amplifier 25.

When WCLK transitions high, latches 88 and 89 of FIG. 4 latch the write address values WADR[0] and WADR[1] onto nodes 90 and 91, respectively. This is illustrated in the waveform labeled LATCHED BADR[1:0] in FIG. 7 by the vertical dashed line. Because signal RWDCLK is a digital low, however, NAND gate 92 of FIG. 4 continues to output a digital high, and gating circuit 93 continues to force both write column address values WCA0 and WCA0N low to their inactive states. The WADR[1] address value that is latched onto node 91 is blocked from being output onto the word line WL because RWDCLK is a digital low and is selecting the upper input lead of multiplexer 83.

Returning to FIG. 6, the high-to-low transition on node 69 is supplied onto the lower input lead of NAND gate 104. NAND gate 104 therefore asserts the internal clock signal ICLK high. This is represented in FIG. 7 by the low-to-high transition of signal ICLK. When ICLK transitions high, the precharging of the bit lines of array 2 is stopped. Precharging transistors 39-44 of FIG. 3 become nonconductive in preparation for the upcoming read operation.

When ICLK transitions high, gating circuit 85 of FIG. 4 no longer forces digital logic level low signals onto both of the word lines. The latched read address value RADR[1] on node 80 is therefore output onto word line WL1 output lead 86. The complement of the read address value is output onto word line WL0 output lead 87. A digital high is therefore present on one of the word lines WL0 and WL1. This is represented in the waveform of FIG. 7 by the low-to-high transitioning of the waveform labeled WL (ONE OF WL0 and WL1). As seen in FIG. 2, the high value on a word line causes all the access transistors of all the memory cells of the associated row of sixteen memory cells to be conductive. One entire sixteen-bit value is output from the array 2 to the eight column multiplexer/demultiplexers. The eight column multiplexers 3-10 select one eight-bit value to be output onto the data output leads of the memory based on the value of the read address values RCA0 and RCA0N. The differential voltages on selected pairs of bit lines are coupled through the multiplexers of the column multiplexer/demultiplexers, and onto the input leads of the sense amplifiers of the column multiplexer/demultiplexers. The resulting eight-bit value is output onto the output leads 60-67 of the memory device 1. The outputting of the eight-bit data value is illustrated in FIG. 7 at time T2 in the waveform labeled DOUT[7:0] (READ).

Returning to FIG. 6, a one shot circuit 105 detects the low-to-high transition of the signal ICLK. After a delay, one shot circuit 105 outputs a high pulse of a RESET signal. This is illustrated in FIG. 7 by the first high pulse in the waveform labeled RESET. In FIG. 7, the dashed arrow labeled A represents the delay introduced by one shot circuit 105.

RESET pulsing high causes RCLK to transition low because the high value of RESET is present on the upper input lead of NAND gate 106 of FIG. 6. RDWCLK is a digital low, so a digital high is also present on the lower input lead of NAND gate 106. NAND gate 106 therefore outputs a digital low signal, thereby causing P-channel transistor 107 to be made conductive. Node 69 is pulled high because node 69 is coupled to VCC through transistor 107. The signal RCLK on node 72 therefore transitions low. This is illustrated in FIG. 7 by the high-to-low transition of the RCLK waveform. It is therefore seen that the time delayed multiplexer 14 and the one shot circuit 105 operate together to clear the RCLK signal low at the end of the read operation.

A digital high is present on the upper input lead of NAND gate 104 in FIG. 6. ICLK is therefore low. When the voltage on node 86 transitions high, a digital high signal is also present on the lower input lead of NAND gate 104. NAND gate 104 therefore outputs a digital low signal. This is illustrated in FIG. 7 by the high-to-low transition of the signal ICLK. The precharging transistors 39-44 in the column multiplexer/demultiplexers are therefore made conductive again to start a precharging operation for the upcoming write operation.

Before the data being output from the memory device can change due to the precharging, a sense signal SENS is supplied to the latched in the sense amplifiers in the column multiplexer/demultiplexers. The low-to-high transition of the signal SENS causes the latches in the column multiplexer/demultiplexers to latch and hold the data values that is being read out on the output leads 60-67 of the memory device 1. A one shot circuit (not shown) generates the SENS signal and pulses the SENS signal high upon the falling edge of the signal ICLK when RWDCLK is low. The latching of the output data is considered the end of the read operation.

RCLK transitioning low when WCLK is a digital high causes a digital low signal to be present on both input leads. of NOR gate 108 in the time delayed multiplexer 14 of FIG. 6. NOR gate 108 therefore outputs a digital high signal. This signal propagates through inverters 109 and 110. RWDCLK therefore transitions high as illustrated in FIG. 7 by the low-to-high transition in the waveform labeled RWDCLK.

Returning to FIG. 4, the low-to-high transition in the signal RWDCLK causes the write address values to be output from the address input latch of FIG. 4. RWDCLK being high causes a digital low to be present on the upper input lead of NAND gate 81. NAND gate 81 therefore outputs a digital high. This causes gating circuit 82 to force RCA0 and RCA0N to digital high values. Forcing both RCA0 and RCA0N high causes the read multiplexer 24 in the column multiplexer/demultiplexers of FIG. 3 to couple no bit lines to the sense amplifiers.

Returning to FIG. 4, RWDCLK being high causes NAND gate 92 to output a digital high signal. Gating circuit 93 therefore no longer blocks the write address value WADR[0] latched in latch 88 from being output onto WCA0 and WCA0N. The write column address value WADR[0] is therefore communicated through gating circuit 93 to the write demultiplexer 26 in the column multiplexer/demultiplexer of FIG. 3. The data input values on DIN[7:0] and DINN[7:0] are therefore communicated through the write demultiplexers of the column multiplexer/demultiplexers onto a selected set of eight pairs of bit lines. Which set of eight pairs is selected is determined by the values of WCA0 and WCA0N. In FIG. 3, the data values are communicated through the write demultiplexer and up into the memory array 2 so that the data values can be written into the row of memory cells identified by word line address values WL0 and WL1.

Returning to FIG. 6, the low-to-high transition of RWDCLK continues to propagate through inverters 111 and 112 and onto the upper input lead of NAND gate 113. Because SCLK has been a digital low, inverter 210 in the suppressor circuit 18 has been outputting a digital high onto the lower input lead of NAND gate 211. Because WCLK is a digital high, NAND gate 211 outputs a digital low, and inverter 212 asserts the signal SWCLK high. Accordingly, when SCLK is low, the write clock WCLK is gated through suppressor circuit 18 and is output as SWCLK.

Because the digital high signal SWCLK has been present on the lower input lead of NAND gate 113 in the time delayed multiplexer 14, the low-to-high transition on the upper input lead of NAND gate 113 causes NAND gate 113 to output a digital low signal, which is inverted by inverter 114. A digital high signal is therefore asserted onto the upper input lead of NAND gate 115. A digital high signal was already present on the lower input lead of NAND gate 115 due to the low value of the signal RESET causing NAND gate 116 of the WCLK generator circuit 13 to output a digital high signal. NAND gate 115 therefore outputs a digital low signal, thereby causing NAND gate 104 to assert ICLK high. This propagation delay from the rising edge of RWDCLK to the rising edge of ICLK is shown in FIG. 7 by the dashed arrow labeled B. The rising edge of the signal ICLK terminates the precharge of the write operation.

Returning to FIG. 4, the rising edge of ICLK is supplied to gating circuit 85. Gating circuit 85 therefore no longer forces both WL0 and WL1 to be low, but rather allows the write address value WADR[1] on node 84 to be output onto word line WL1 output lead 86. The write address value that was latched into node 91 is multiplexed onto node 84 due to the value of RWDCLK being a digital high during the write operation. The result is that the write address value WADR [1] is output onto WL1 output lead 86 and its complement is output onto WL0 output lead 87. This is illustrated in FIG. 7 by the transitioning in the waveform labeled WL (ONE OF WL0 AND WL1).

The write address value WADR[0] and WADR[1] are therefore used to address memory array 2 during the write operation. This is represented in FIG. 7 by the label WCA that appears in the waveform labeled COLUMN ADR TO COL MUX. Data in the eight addressed memory cells may switch at time T3 as illustrated in FIG. 7.

Returning to FIG. 6, the low-to-high transitioning of ICLK is again detected by one shot circuit 105. After a delay represented in FIG. 7 by the dashed arrow labeled C, one shot circuit 105 outputs a high pulse of the signal RESET. The high pulse of the signal RESET is asserted onto the upper input lead of NAND gate 116. Because RWDCLK is now high, there are digital high signals on both input leads of NAND gate 116. NAND gate 116 drives a digital low signal onto the gate of P-channel transistor 117, thereby latching a digital high signal onto node 73 in the WCLK generator circuit 13. Signal WCLK on node 76 therefore transitions low. This is illustrated in FIG. 7 by the high-to-low transition of the waveform WCLK. The time delayed multiplexer 14 and one shot circuit 105 therefore together cause the resetting of the signal WCLK low at the end of the write operation.

WCLK transitioning low causes NAND gate 211 in suppressor circuit 18 to output a digital high. Inverter 212 therefore forces SWCLK low. WCLK is therefore gated through suppressor circuit 18 because the suppression signal SCLK is low.

SWCLK transitioning low causes NAND gate 113 in time delayed multiplexer 14 to output a digital high. Inverter 114 outputs a digital low thereby causing NAND gate 115 to output a digital high. Because RCLK is a digital low, the voltage on node 69 in the RCLK generator circuit 12 is a digital high. There are digital high signals on both input leads of NAND gate 104, thereby causing NAND gate 104 to assert ICLK low. This is illustrated in FIG. 7 by the second high-to-low transition of the signal ICLK.

SWCLK transitioning low also causes a digital high signal to be present on the lower input lead of NOR gate 108 of FIG. 6. NOR gate 108 outputs a digital low signal that propagates through inverters 109 and 110, thereby causing RWDCLK to transition low at the end of the write operation. This is illustrated in FIG. 7 by the high-to-low transition in the waveform labeled RWDCLK. At this point, precharging of the bit lines of memory array 2 is initiated in preparation for a subsequent memory access operation.

It is therefore recognized that pseudo-dual port memory device 1 performs a read operation followed by a write operation. The end of the read operation and the beginning of the write operation are not dependent on the falling edge of an input clock signal. Rather, asynchronous propagation delays through logic circuitry and a one shot circuit are used to time the control signals necessary to carry out the first read operation, to precharge the bit lines of the memory for a second operation, and to carry out the second write operation. The amounts of time of delay A, delay B, and delay C can be increased or decreased during the design of a memory device in order to change the relative amount of time that is allotted for the read operation versus the write operation.

Figure 7A:
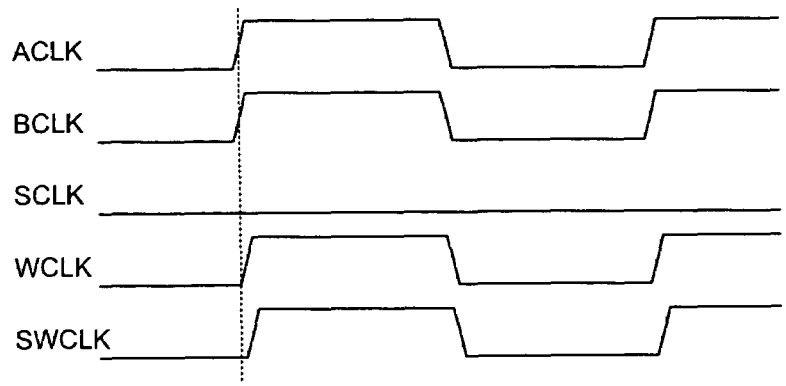
FIG. 7A is a simplified waveform diagram of the first scenario (Case #1).

FIG. 7A is a simplified waveform diagram for case #1. The rising edges of ACLK and BCLK coincide. SCLK remains low and never transitions high. The suppressor circuit 18 of FIG. 6 therefore always passes the value of WCLK through to be the value of SWCLK. The signal SWCLK is supplied to the time delayed multiplexer 14 in the place of WCLK. The time delayed multiplexer 14 therefore receives RCLK and SWCLK (which has the same timing as WCLK), and generates the time delayed signal RWDCLK so as to perform the read operation followed by the write operation.

In the above-described scenario, there is both a read operation and a write operation to be performed. In a scenario in which only a read operation is to be performed, then RCLK would be latched high, RWDCLK would be forced low for the read operation, one shot circuit 105 would then clear RCLK low, but WCLK would not have been latched high. Consequently, RWDCLK would not be forced high at the end of the read operation, and there would be no second write operation.

Similarly, in a scenario in which only a write operation is to be performed, then WCLK would be latched high but RCLK would not be latched high. RWDCLK would therefore be forced high for a write operation, one shot circuit 105 would then reset WCLK low at the end of the read operation, but there would be no second memory operation.

Consider a situation in which WCLK were latched high when RCLK had not yet been latched high. Time delayed multiplexer 14 would assert RWDCLK high for a write operation and the write operation would be initiated as described above in a condition wherein a write operation is to be performed but no read operation is to be performed. If RCLK were then latched high (as in case #3) due to an attempted read from the first port, then NOR gate 108 in time delayed multiplexer 14 would output a digital low, the low signal would propagate through inverters 109 and 110, and RWDCLK would be asserted low. Asserting RWDCLK low before completion of the write operation, however, may cause a malfunction of the pseudo-dual port memory. The suppression clock generator 17 and the suppressor circuit 18 prevent such a situation by suppressing assertion of WCLK high as it is presented to time delayed multiplexer 14 (WCLK is presented to time delayed multiplexer 14 as SWCLK) until the RCLK signal has transitioned high. Suppression of WCLK in this manner prevents the malfunction that would otherwise have occurred if RCLK were asserted shortly after a write operation had been initiated.

FIG. 8 is a waveform diagram that illustrates an operation of pseudo-dual port memory 1 in case #2. In case #2, the first input clock signal ACLK that is supplied to the first port of the memory is asserted high first at time T1A. The values of CSAN and AADR[1:0] are therefore latched into the memory shortly after time T1A. The second input clock signal BCLK that is supplied to the second port of the memory is asserted some time later at time T1B. The values of CSBN and BADR[1:0] and DATAIN[7:0] are therefore latched into the memory shortly after time T1B.

Because the read operation is to occur before the write operation, the earlier rising ACLK causes RCLK to be asserted. RCLK in turn initiates the read operation before the rising edge of BCLK. When the read operation is completed as determined by propagation delay A and the subsequent falling edge of RCLK, the time delayed multiplexer 14 of FIG. 6 asserts RWDCLK to initiate the write operation. The write clock signal WCLK, which at that time has been asserted, is gated through suppressor circuit 18 and is supplied to time delayed multiplexer 14 in the form of SWCLK. When the read operation is completed, the time delayed multiplexer 14 is therefore able to initiate the write operation.

Figure 8A:
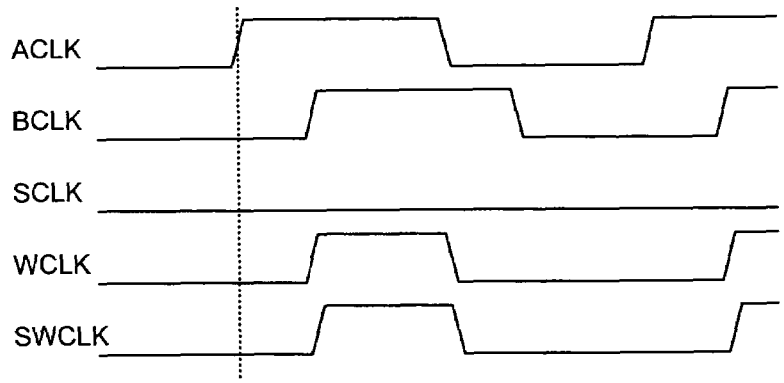
FIG. 8A is a simplified waveform diagram of the second scenario (Case #2).

FIG. 8A is a simplified waveform diagram for case #2. The rising edge of ACLK precedes the rising edge of BCLK. SCLK remains low and never transitions high. The suppressor circuit 18 of FIG. 6 therefore never suppresses WCLK. WCLK is gated through suppressor circuit 18 and is supplied to time delayed multiplexer 14 as SWCLK. Because the write signal SWCLK is present at the time delayed multiplexer 14 at the time when the read operation is completed, time delayed multiplexer 14 is able to initiate the write operation in the same way as in case #1.

FIG. 9 is a waveform diagram that illustrates an operation of pseudo-dual port memory 1 in case #3. In case #3, the second input clock signal BCLK that is supplied to the second port of the memory is asserted first at time T1B. The values of CSBN and BADR[1:0] and DATAIN[7:0] for the write operation are therefore latched into the memory shortly after time T1B. The first input clock signal ACLK that is supplied to the first port of the memory is asserted some time later at time T1A. The values of CSAN and AADR[1:0] for the read operation are therefore latched into the memory shortly after time T1A.

Because the write operation is to occur after the read operation, the earlier rising BCLK cannot be allowed to assert SWCLK high so that the write operation is initiated. The suppression clock SCLK is therefore asserted high during an initial period (roughly between time T1B and time T1A) until the read clock ACLK transitions high. During this initial period, SCLK suppresses the write clock that is being supplied to the time delayed multiplexer 14 (the write clock WCLK is supplied to time delayed multiplexer 14 as SWCLK). Suppressing SWCLK during this initial period prevents the time delayed multiplexer 14 from initiating the write operation before the read operation.

Generation of the suppression clock SCLK is explained in connection with FIG. 6. ACLK at this time is low. Inverter 205 therefore outputs a digital high onto node 200. P-channel transistor 201 is therefore non-conductive and N-channel transistor 206 is conductive. BCLK is initially low, and then transitions high. Inverters 213-215 therefore initially output a digital high onto the gate of N-channel transistor 216. Transistor 216 is therefore initially conductive but node 204 is not coupled to ground because N-channel transistor 203 is nonconductive. When BCLK transitions high, the voltage on node 202 transitions high thereby making N-channel transistor 203 conductive. It takes time, however, for the high signal on node 202 to propagate through inverters 213-215 to force the gate of N-channel transistor 216 low and turn transistor 216 off. Therefore, for a short period of time after the rising edge of BCLK, all three N-channel pulldown transistors 203, 216 and 206 are conductive and node 204 is momentarily coupled to ground potential. The momentary coupling to ground potential latches a digital low onto node 204. The suppression clock SCLK on node 209 is therefore asserted high. This illustrated in FIG. 9 by the rising edge of the waveform labeled SCLK.

Even through WCLK rises shortly after time T1B, the high value of suppression clock SCLK suppresses the write clock signal SWCLK supplied to the time delayed multiplexer 14. This condition persists until the input clock signal ACLK for the read port transitions high. When ACLK transitions high, inverter 205 outputs a digital low onto node 200. P-channel pullup transistor 201 is made conductive, and node 204 is latched and held high. SCLK is therefore latched and held low, thereby ending the initial period of time that the suppression clock SCLK is asserted. The rising edges of RCLK and SWCLK are therefore presented to time delayed multiplexer 14 at substantially the same time.

Figure 9A:
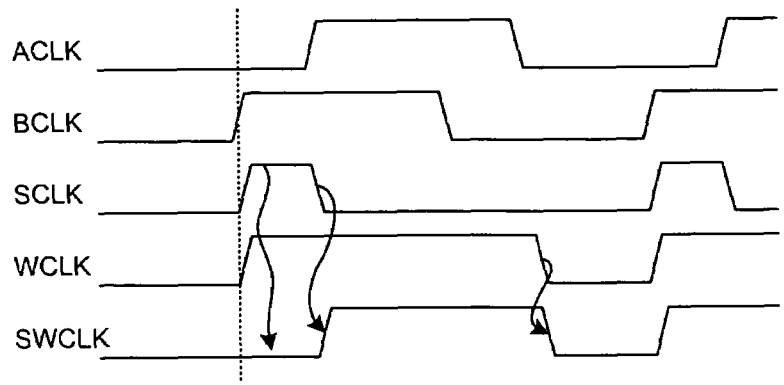
FIG. 9A is a simplified waveform diagram of the third scenario (Case #3).

FIG. 9A is a simplified waveform diagram for case #3. The rising edge of BCLK precedes the rising edge of ACLK. The rising edge of BCLK when ACLK is low causes the latch in the suppression clock generator 17 of FIG. 6 to latch a digital low onto node 204, thereby latching suppression clock signal SCLK high. The suppressor circuit 18 of FIG. 6 therefore suppresses SWCLK and keeps SWCLK low during the time SCLK is high. When ACLK transitions high, a digital high is latched onto node 204 in the suppression clock generator 17, thereby latching SCLK low. SWCLK is therefore no longer held low by suppressor circuit 18. The value of the write clock WCLK is the value of SWCLK for the remainder of the read and write operations. The time delayed multiplexer 14 and one shot 105 initiate the read operation and then the write operation as in cases #1 and #2.

FIG. 10 is a simplified waveform diagram illustrating an operation of pseudo-dual port memory 1 in a situation in which ACLK has a higher frequency than BCLK. The first rising edge of ACLK occurs at the same time as the first rising edge of BCLK. This is the situation of FIG. 7. The first write operation follows the first read operation. In the scenario of FIG. 10, there is no rising edge of BCLK around the time of the second rising edge of ACLK. The second rising edge of BCLK in FIG. 10 therefore gives rise to a second read operation. In the example, the third rising edge of ACLK occurs at the same time as the second rising edge of BCLK. This is the condition of FIG. 7. The second write operation therefore follows the third read operation.

FIG. 11 is a simplified waveform diagram illustrating an operation of pseudo-dual port memory 1 in a situation in which a rising edge of BCLK occurs at an earlier time during the low portion of ACLK. The rising edge of BCLK causes SCLK to be asserted, thereby suppressing SWCLK until the third rising edge of ACLK. The write operation is therefore delayed until after the third read operation.

FIG. 12 is a simplified waveform diagram illustrating an operation of pseudo-dual port memory 1 in a situation in which a rising edge of BCLK occurs more than three gate delays before the falling edge of ACLK. BCLK therefore rises during the time ACLK is high. In this situation, ACLK is high and is holding node 204 pulled up to VCC when the rising edge of BCLK attempts to momentarily pull node 204 to ground. Because N-channel transistor 206 is nonconductive, node 204 is not pulled to ground and SCLK is not latched high. SWCLK is therefore not suppressed during an initial period. SWCLK is therefore illustrated going high shortly after BCLK transitions high. This causes a write operation to occur immediately following the second read operation. The second read operation in the waveform of FIG. 12 is the read operation due to the second rising edge of ACLK.

The amounts of time of delay A, delay B, and delay C can be increased or decreased during the design of a memory device in order to change the relative proportion of time that is allotted for the read operation versus the write operation. The end of the read operation can overlap the beginning of the write operation in time. In some implementations of a memory device, the read operation may be allotted more time than the write operation. In other implementations, the write operation may be allotted more time than the read operation. Problems associated with initiating the write operation using the falling edge of an external clock signal where the falling edge has an undesirably large amount of jitter are avoided because the falling edge of an externally supplied clock signal is not used to terminate the first read operation and/or to initiate the second write operation.

Although certain specific embodiments are described above for instructional purposes, the present invention is not limited thereto. The control circuitry of the pseudo-dual port memory can be used in embodiments where the first memory access operation is a write operation and the second memory access operation is a read operation, where the first memory access operation is a write operation and the second memory access operation is a write operation, and where the first memory access operation is a read operation and the second memory access operation is a read operation. Accordingly, various modifications, adaptations, and combinations of the various features of the described specific embodiments can be practiced without departing from the scope of the invention as set forth in the claims.

What is claimed is:

1. A pseudo-dual port memory, comprising:
   an array of memory cells, wherein each memory cell in the array is a six-transistor memory cell;
   a first port comprising a first plurality of address input leads and a clock input lead, wherein a first low-to-high transition of a first clock input signal on the clock input lead of the first port causes an address on the first plurality of address input leads to be latched into the pseudo-dual port memory and initiates a first memory access of the array of memory cells; and
   a second port comprising a second plurality of address input leads and a clock input lead, wherein:
      in a first case: a low-to-high transition of a second clock input signal on the clock input lead of the second port during a first time period would cause an address on the second plurality of address input leads to be latched into the pseudo-dual port memory and would cause a second memory access of the array of memory cells to be initiated following completion of the first memory access and before a second low-to-high transition of the first clock input signal, and
      in a second case: a low-to-high transition of the second clock input signal on the clock input lead of the second port during a second time period would cause the second memory access of the array of memory cells to be delayed until after the second low-to-high transition of the first clock input signal, wherein an end of the first time period coincides with a beginning of the second time period.

2. The pseudo-dual port memory of claim 1, wherein the first clock input signal transitions high at the first low-to-high transition, then remains high for an amount of time, then transitions low, then remains low for an amount of time, and then transitions high at the second low-to-high transition, wherein the first low-to-high transition of the first clock input signal substantially coincides with a start of the first time period, and wherein the first time period substantially coincides with the amount of time the first clock input signal remains high.

3. The pseudo-dual port memory of claim 1, wherein the first clock input signal has a duty cycle, and wherein the first memory access has a duration, the duration of the first memory access being substantially independent of the duty cycle of the first clock input signal.

4. The pseudo-dual port memory of claim 1, wherein the first port is a read only port and wherein the second port is a write only port.

5. The pseudo-dual port memory of claim 1, wherein in the first case the second memory access is initiated substantially immediately following completion of the first memory access.

6. The pseudo-dual port memory of claim 1, wherein the second memory access includes an initial precharge period and a subsequent period during which information is written into memory cells of the array.

7. The pseudo-dual port memory of claim 1, further comprising:
a time delayed multiplexer that has a read clock signal input lead, a suppressed write clock signal input lead, and a control signal output lead, wherein the control signal output lead of the time delayed multiplexer carries a control signal that determines whether the array of memory cells is addressed for the first memory access or is addressed for the second memory access;
a read clock generator that has an input lead and an output lead, the first clock input signal being present on the input lead, the output lead being coupled to the read clock signal input lead of the time delayed multiplexer;
a write clock generator that has an input lead and an output lead, the second clock input signal being present on the input lead; and
a write clock suppressor circuit having a first input lead, a second input lead, a third input lead, and an output lead, the first clock input signal being present on the first input lead, the second clock input signal being present on the second input lead, the third input lead being coupled to the output lead of the write clock generator, the output lead being coupled to the suppressed clock signal input lead of the time delayed multiplexer, wherein the write clock suppressor circuit either passes a signal on the third input lead to the output lead or suppresses the signal on the third input lead from being passed to the output lead, and wherein the write clock suppressor circuit suppresses the signal on the third input lead from being passed to the output lead in the second case during a time period starting at the low-to-high transition of the second clock input signal and ending upon the second low-to-high transition of the first clock input signal.

8. A method, comprising:
receiving a first clock signal on a clock signal input lead of a first port of a pseudo-dual port memory, wherein the first clock input signal transitions high at a first low-to-high transition, then remains high for an amount of time, then transitions low at a high-to-low transition, then remains low for an amount of time, and then transitions high at a second low-to-high transition;
receiving a second clock signal on a clock signal input lead of a second port of the pseudo-dual port memory;
performing a first memory access operation in response to the first low-to-high transition of the first clock signal, the first memory access operation being initiated during the amount of time the first clock signal remains high, wherein the first memory access operation is an access of an array of memory cells of the pseudo-dual port memory, wherein each of the memory cells is a six-transistor memory cell, and wherein the first memory access operation has a duration, the duration being substantially independent of the amount of time the first clock signal remains high; and
performing a second memory access operation in response to a low-to-high transition of the second clock signal, wherein the second memory access operation is an access of the array of memory cells of the pseudo-dual port memory, wherein the second memory access operation is initiated substantially immediately after completion of the first memory access operation if the low-to-high transition of the second clock signal occurs in a first time period, and wherein the second memory access operation is not initiated immediately after completion of the first memory access but rather is initiated after the second low-to-high transition of the first clock signal if the low-to-high transition of the second clock signal occurs in a second time period, wherein an end of the first time period coincides with a beginning of the second time period.

9. The method of claim 8, wherein the first time period is substantially the same as the amount of time the first clock signal remains high, and wherein the second time period is substantially the same as the amount of time the first clock signal remains low.

10. The method of claim 8, wherein the first port is a read only port, and wherein the second port is write only port.

11. The method of claim 8, wherein the high-to-low transition of the first clock signal is not used to control when the first memory access operation is completed, and wherein the high-to-low transition of the first clock signal is not used to control when the second memory access operation is initiated.

12. The method of claim 8, wherein the second memory access operation includes an initial precharge period and a subsequent period during which information is written into memory cells of the array.

13. The method of claim 8, further comprising:
setting a latch in a read clock generator upon the first low-to-high transition of the first clock signal, the latch outputting a read clock signal;
setting a latch in a write clock generator upon the low-to-high transition of the second clock signal, the latch outputting a write clock signal;
running the write clock signal through a suppressor circuit, the suppressor circuit outputting a suppressed write clock signal, wherein the suppressed write clock signal is substantially identical to the write clock signal if a suppression clock input signal is not asserted, and wherein the suppressed write clock signal is suppressed if the suppression clock input signal is asserted;
setting a latch in a suppression clock generator when the first clock signal is high and clearing the latch in the suppression clock generator if the second clock signal transitions high when the first clock signal is low, wherein suppression clock generator outputs the suppression clock input signal to the suppression circuit, the suppression clock input signal being high if the latch in the suppression clock generator is set, the suppression clock input signal being low if the latch in the suppression clock generator is cleared;
receiving the read clock signal and the suppressed write clock signal onto a time delayed multiplexer, the time delayed multiplexer outputting a control signal that determines whether the array of memory cells is addressed for the first memory access operation or is addressed for the second memory access operation.

14. The method of claim 13, further comprising:
outputting a precharge signal from the time delayed multiplexer, the precharge signal having a first transition during the first memory access operation, the precharge signal having a second transition during the second memory access operation;

using a one shot circuit to generate a first reset pulse in response to the first transition of the precharge signal, the first reset pulse clearing the latch in the read clock generator; and using the one shot circuit to generate a second reset pulse in response to the second transition of the precharge signal, the second reset pulse clearing the latch in the write clock generator.

15. A memory, comprising:

an array of memory cells, wherein each memory cell in the array is a six-transistor memory cell;

a first port comprising a first plurality of address input leads and a clock input lead, a first clock signal being present on the clock input lead of the first port, wherein the first clock input signal transitions high at a first low-to-high transition, then remains high for an amount of time, then transitions low at a high-to-low transition, then remains low for an amount of time, and then transitions high at a second low-to-high transition;

a second port comprising a second plurality of address input leads and a clock input lead, a second clock signal being present on the clock input lead of the second port; and means for initiating a first memory access of the array in response to the first low-to-high transition of a first clock signal on the clock input lead of the first port, wherein the first memory access has a duration, the duration being substantially independent of the amount of time the first clock signal remains high, the means also being for:

in a first case: initiating a second memory access of the array substantially immediately following completion of the first memory access if a low-to-high transition of the second clock signal is detected by the means during a first period, and in a second case: initiating the second memory access after the second low-to-high transition of the first clock signal if the low-to-high transition of the second clock signal is detected by the means during a second period, wherein an end of the first time period coincides with a beginning of the second time period.

16. The memory of claim 15, wherein the first time period roughly coincides with the amount of time the first clock period remains high.

17. The memory of claim 15, wherein in the second case the first memory access completes, then a delay occurs, and then the means initiates the second memory access.

18. The memory of claim 15, wherein the first port is a read only port, and wherein the second port is a write only port.

19. The memory of claim 15, wherein the memory is a pseudo-dual port memory.

20. The memory of claim 15, wherein the second memory access includes an initial precharge period and a subsequent period during which information is written into memory cells of the array.

21. A pseudo-dual port memory, comprising:

an array of memory cells, wherein each memory cell in the array includes a plurality of transistors;

a first port comprising a first plurality of address input leads and a clock input lead, wherein a first low-to-high transition of a first clock input signal on the clock input lead of the first port causes an address on the first plurality of address input leads to be latched into the pseudo-dual port memory and initiates a first memory access of the array of memory cells; and a second port comprising a second plurality of address input leads and a clock input lead, wherein:

in a first case: a low-to-high transition of a second clock input signal on the clock input lead of the second port during a first time period would cause an address on the second plurality of address input leads to be latched into the pseudo-dual port memory and would cause a second memory access of the array of memory cells to be initiated following completion of the first memory access and before a second low-to-high transition of the first clock input signal, and in a second case: a low-to-high transition of the second clock input signal on the clock input lead of the second port during a second time period would cause the second memory access of the array of memory cells to be delayed until after the second low-to-high transition of the first clock input signal, wherein an end of the first time period coincides with a beginning of the second time period.

22. A method, comprising:

receiving a first clock signal on a clock signal input lead of a first port of a pseudo-dual port memory, wherein the first clock input signal transitions high at a first low-to-high transition, then remains high for an amount of time, then transitions low at a high-to-low transition, then remains low for an amount of time, and then transitions high at a second low-to-high transition;

receiving a second clock signal on a clock signal input lead of a second port of the pseudo-dual port memory;

performing a first memory access operation in response to the first low-to-high transition of the first clock signal, the first memory access operation being initiated during the amount of time the first clock signal remains high, wherein the first memory access operation is an access of an array of memory cells of the pseudo-dual port memory, wherein each of the memory cells includes a plurality of transistors, and wherein the first memory access operation has a duration, the duration being substantially independent of the amount of time the first clock signal remains high; and performing a second memory access operation in response to a low-to-high transition of the second clock signal, wherein the second memory access operation is an access of the array of memory cells of the pseudo-dual port memory, wherein the second memory access operation is initiated substantially immediately after completion of the first memory access operation if the low-to-high transition of the second clock signal occurs in a first time period, and wherein the second memory access operation is not initiated immediately after completion of the first memory access but rather is initiated after the second low-to-high transition of the first clock signal if the low-to-high transition of the second clock signal occurs in a second time period, wherein an end of the first time period coincides with a beginning of the second time period.

* * * * *

(12) EX PARTE REEXAMINATION CERTIFICATE (7212th)
United States Patent
Jung

(10) Number: US 7,319,632 C1
(45) Certificate Issued: Dec. 1, 2009

(54) PSEUDO-DUAL PORT MEMORY HAVING A CLOCK FOR EACH PORT

(75) Inventor: Chang Ho Jung, San Diego, CA (US)

(73) Assignee: QUALCOMM Incorporated, San Diego, CA (US)

Reexamination Request:
No. 90/010,164, May 13, 2008

Reexamination Certificate for:
Patent No.: 7,319,632
Issued: Jan. 15, 2008
Appl. No.: 11/282,345
Filed: Nov. 17, 2005

(51) Int. Cl.
*G11C 8/00* (2006.01)

(52) U.S. Cl. .................... 365/230.05; 365/154
(58) Field of Classification Search .......... None
See application file for complete search history.

(56) References Cited

U.S. PATENT DOCUMENTS

2005/0007170 A1 * 1/2005 Nakahara et al. ............ 327/199

OTHER PUBLICATIONS

PCT/US2006/061044, filed Nov. 2006, U.S.*

* cited by examiner

*Primary Examiner*—B. James Peikari

(57) ABSTRACT

A pseudo-dual port memory has a first port, a second port, and an array of six-transistor memory cells. A first memory access is initiated upon a rising edge of a first clock signal received onto the first port. A second memory access is initiated in response to a rising edge of a second clock signal received onto the second port. If the rising edge of the second clock signal occurs within a first period of time, then the second memory access is initiated immediately following completion of the first memory access in pseudo-dual port fashion. If the rising edge of the second clock signal occurs later within a second period of time, then the second memory access is delayed until after a second rising edge of the first clock signal. The durations of the first and second memory accesses do not depend on the duty cycles of the clock signals.

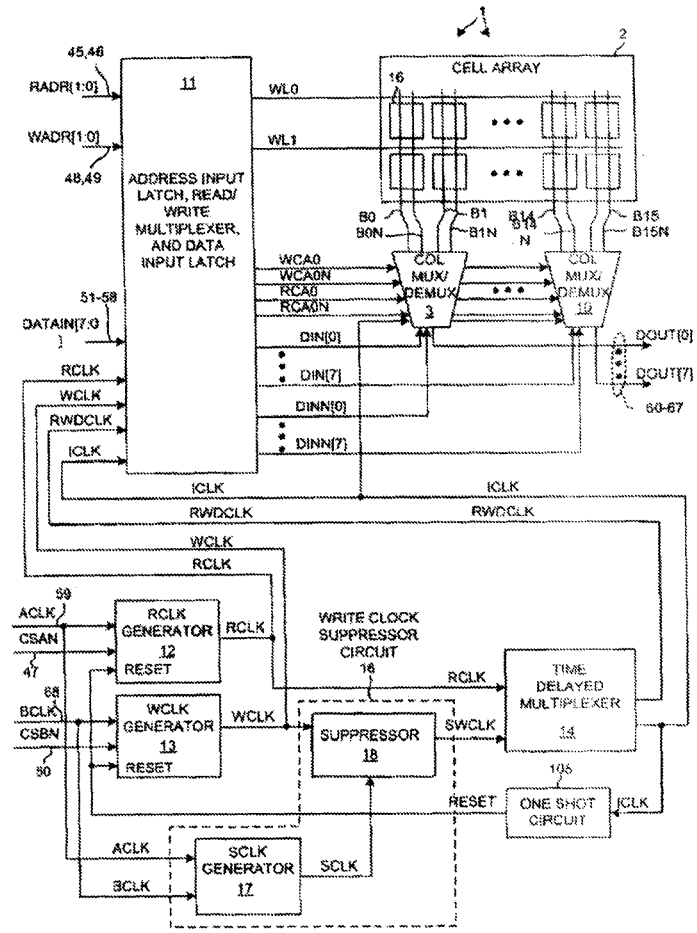

US 7,319,632 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 15, lines 22–34:

FIG. 10 is a simplified waveform diagram illustrating an operation of pseudo-dual port memory 1 in a situation in which ACLK has a higher frequency than BCLK. The first rising edge of ACLK occurs at the same time as the first rising edge of BCLK. This is the situation of FIG. 7. The first write operation follows the first read operation. In the scenario of FIG. 10, there is no rising edge of BCLK around the time of the second rising edge of ACLK. The second rising edge of [BCLK] *ACLK* in FIG. 10 therefore gives rise to a second read operation. In the example, the third rising edge of ACLK occurs at the same time as the second rising edge of BCLK. This is the condition of FIG. 7. The second write operation therefore follows the third read operation.

AS A RESULT OF REEXAMINATION, IT HAS BEEN DETERMINED THAT:

Claims 1, 2, 8–10, 15–17, 21 and 22 are determined to be patentable as amended.

Claims 3–6, 11–12 and 18–20, dependent on an amended claim, are determined to be patentable.

New claims 23–37 are added and determined to be patentable.

Claims 7, 13 and 14 were not reexamined.

1. A pseudo-dual port memory, comprising:
an array of memory cells, wherein each memory cell in the array is a six-transistor memory cell;
a first port comprising a first plurality of address input leads and a clock input lead, wherein a first low-to-high transition of a first clock input signal on the clock input lead of the first port causes an address on the first plurality of address input leads to be latched into the pseudo-dual port memory and initiates a first memory access of the array of memory cells; and
a second port comprising a second plurality of address input leads and a clock input lead, wherein:
in a first case: a low-to-high transition of a second clock input signal on the clock input lead of the second port during a first time period [would cause] *causes* an address on the second plurality of address input leads to be latched into the pseudo-dual port memory and [would cause] *causes* a second memory access of the array of memory cells to be initiated following completion of the first memory access and before a second low-to-high transition of the first clock input signal, and in a second case: a low-to-high transition of the second clock input signal on the clock input lead of the second port during a second time period [would cause] *causes* the second memory access of the array of memory cells to be delayed until after the second low-to-high transition of the first clock input signal, wherein an end of the first time period coincides with a beginning of the second time period, *wherein the second memory access is delayed by a delay introduced by a time delay element.*

2. The pseudo-dual port memory of claim 1, wherein the first clock input signal transitions high at the first low-to-high transition, then remains high for [an] *a first* amount of time, then transitions low, then remains low for [an] *a second* amount of time, and then transitions high at the second low-to-high transition *of the first clock input signal*, wherein the first low-to-high transition of the first clock input signal substantially coincides with a start of the first time period, and wherein the first time period substantially coincides with the *first* amount of time [the first clock input signal remains high].

8. A method, comprising:
receiving a first clock signal on a clock signal input lead of a first port of a pseudo-dual port memory, wherein the first clock [input] signal transitions high at a first low-to-high transition, then remains high for [an] *a first* amount of time, then transitions low at a high-to-low transition, then remains low for [an] *a second* amount of time, and then transitions high at a second low-to-high transition;
receiving a second clock signal on a clock signal input lead of a second port of the pseudo-dual port memory;
performing a first memory access operation in response to the first low-to-high transition of the first clock signal, the first memory access operation being initiated during the *first* amount of time [the first clock signal remains high], wherein the first memory access operation is an access of an array of memory cells of the pseudo-dual port memory, wherein each of the memory cells is a six-transistor memory cell, and wherein the first memory access operation has a *first* duration, the *first* duration being substantially independent of the *first* amount of time [the first clock signal remains high]; and
performing a second memory access operation in response to a low-to-high transition of the second clock signal, wherein the second memory access operation is an access of the array of memory cells of the pseudo-dual port memory, wherein the second memory access operation is initiated substantially immediately after completion of the first memory access operation if the low-to-high transistion of the second clock signal occurs in a first time period, and wherein the second memory access operation is not initiated immediately after completion of the first memory access but rather is initiated after the second low-to-high transition of the first clock signal if the low-to-high translation of the second clock signal occurs in a second time period, *wherein the second memory access operation is initiated following a delay introduced by a time delay element, and* wherein an end of the first time period coincides with a beginning of the second time period.

9. The method of claim 8, wherein the first time period is substantially the same as the *first* amount of time the first clock signal remains high, and wherein the second time period is substantially the same as the *second* amount of time [the first clock signal remains low].

10. The method of claim 8, wherein the first port is a read only port, and wherein the second port is *a* write only port.

15. A memory, comprising:

an array of memory cells, wherein each memory cell in the array is a six-transistor memory cell;

a first port comprising a first plurality of address input leads and a clock input lead, a first clock signal being present on the clock input lead of the first port, wherein the first clock [input] signal transitions high at a first low-to-high transition, then remains high for [an] *a first* amount of time, then transitions low at a high-to-low transition, then remains low for [an] *a second* amount of time, and then transitions high at a second low-to-high transition;

a second port comprising a second plurality of address input leads and a clock input lead, a second clock signal being present on the clock input lead of the second port; and means for initiating a first memory access of the array in response to the first low-to-high transition of [a] *the* first clock signal on the clock input lead of the first port, wherein the first memory access has a duration, the duration being substantially independent of the amount of the first clock signal remains high, the means also being for:

in a first case: initiating a second memory access of the array substantially immediately following completion of the first memory access if a low-to-high transition of the second clock signal is detected by the means during a first *time* period, and in a second case: initiating the second memory access after the second low-to-high transition of the first clock signal if the low-to-high transition of the second clock signal is detected by the means during a second *time* period, wherein an end of the first time period coincides with a beginning of the second time period, *wherein the second memory access is delayed by a delay introduced by a time delay element.*

16. The memory of claim 15, wherein the first time period roughly coincides with the *first* amount of time [the first clock period remains high].

17. The memory of claim 15, wherein the second case the first memory access completes, then [a] *the* delay occurs, and then the means initiates the second memory access.

21. A pseudo-dual port memory, comprising:

an array of memory cells, wherein each memory cell in the array includes a plurality of transistors;

a first port comprising a first plurality of address input leads and a clock input lead, wherein a first low-to-high transition of a first clock input signal on the clock input lead of the first port causes an address on the first plurality of address input leads to be latched into the pseudo-dual port memory and initiates a first memory access of the array of memory cells; and a second port comprising a second plurality of address input leads and a clock input lead, wherein:

in a first case: a low-to-high transition of a second clock input signal on the clock input lead of the second port during a first time period [would cause] *causes* an address on the second plurality of address input leads to be latched into the pseudo-dual port memory and [would cause] *causes* a second memory access of the array of memory cells to be initiated following completion of the first memory access and before a second low-to-high transition of the first clock input signal, and in a second case: a low-to-high transition of the second clock input signal on the clock input lead of the second port during a second time period [would cause] *causes* the second memory access of the array of memory cells to be delayed until after the second low-to-high transition of the first clock input signal, *wherein the second memory access is delayed by a delay introduced by a time delay element, and wherein an end of the first time period coincides with a beginning of the second time period.*

22. A method, comprising:

receiving a first clock signal on a clock signal input lead of a first port of a pseudo-dual port memory, wherein the first clock [input] signal transitions high at a first low-to-high transition, then remains high for [an] *a first* amount of time, then transitions low at a high-to-low transition, then remains low for [an] *a second* amount of time, and then transitions high at a second low-to-high transition;

receiving a second clock signal on a clock signal input lead of a second port of the pseudo-dual port memory;

performing a first memory access operation in response to the first low-to-high transition of the first clock signal, the first memory access operation being initiated during the *first* amount of time [the first clock signal remains high], wherein the first memory access operation is an access of an array of memory cells of the pseudo-dual port memory, wherein each of the memory cells includes a plurality of transistors, and wherein the first memory access operation has a duration, the duration being substantially independent of the *first* amount of time [the first clock signal remains high]; and performing a second memory access operation in response to a low-to-high transition of the second clock signal, wherein the second memory access operation is an access of the array of memory cells of the pseudo-dual port memory, wherein the second memory access operation is initiated substantially immediately after completion of the first memory access operation if the low-to-high transition of the second clock signal occurs in a first time period, and wherein the second memory access operation is not initiated immediately after completion of the first memory access but rather is initiated after the second low-to-high transition of the first clock signal if the low-to-high transition of the second clock signal occurs in a second time period, *wherein the second memory access operation is initiated following a delay introduced by a time delay element, and* wherein an end of the first time period coincides with a beginning of the second time period.

*23. The pseudo dual-port memory of claim 1, wherein the time delay element comprises a time-delayed multiplexer.*

*24. The pseudo-dual port memory of claim 1, wherein the first time period begins at the first low-to-high transition of the first clock input signal and wherein the first time period ends at a high-to-low transition of the first clock input signal.*

*25. The pseudo-dual port memory of claim 1, wherein the second time period begins prior to the first low-to-high transition of the first clock input signal.*

*26. The method of claim 8, wherein the time delay element comprises a time-delayed multiplexer.*

*27. The method of claim 8, wherein the first time period begins at the first low-to-high transition of the first clock signal and wherein the first time period ends at the high-to-low transition of the first clock signal.*

*28. The method of claim 8, wherein the second time period begins prior to the first low-to-high transition of the first clock signal.*

29. The memory of claim 15, wherein the time delay element comprises a time-delayed multiplexer.

30. The memory of claim 15, wherein the first time period begins at the first low-to-high transition of the first clock signal and wherein the first time period ends at the high-to-low transition of the first clock signal.

31. The memory of claim 15, wherein the second time period begins prior to the first low-to-high transition of the first clock input signal.

32. The pseudo-dual port memory of claim 21, wherein the time delay element comprises a time-delayed multiplexer.

33. The pseudo-dual port memory of claim 21, wherein the first time period begins at the first low-to-high transition of the first clock input signal and wherein the first time period ends at a high-to-low transition of the first clock input signal.

34. The pseudo-dual port memory of claim 21, wherein the second time period begins prior to the first low-to-high transition of the first clock input signal.

35. The method of claim 22, wherein the time delay element comprises a time-delayed multiplexer.

36. The method of claim 22, wherein the first time period begins at the first low-to-high transition of the first clock signal and wherein the first time period ends at the high-to-low transition of the first clock signal.

37. The method of claim 22, wherein the second time period begins prior to the first low-to-high transistion of the first clock signal.

* * * * *